(12) United States Patent
Lee et al.

(10) Patent No.: US 12,140,752 B2
(45) Date of Patent: Nov. 12, 2024

(54) THERMAL CONTROL OF MEMS MIRRORS TO LIMIT RESONANT FREQUENCY SHIFT

(71) Applicant: Beijing Voyager Technology Co., Ltd., Beijing (CN)

(72) Inventors: Sae Won Lee, Mountain View, CA (US); Youmin Wang, Mountain View, CA (US); Anan Pan, Mountain View, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 989 days.

(21) Appl. No.: 17/137,211

(22) Filed: Dec. 29, 2020

(65) Prior Publication Data

US 2022/0206285 A1    Jun. 30, 2022

(51) Int. Cl.
| | |
|---|---|
| B81B 3/00 | (2006.01) |
| G01S 7/481 | (2006.01) |
| G01S 17/931 | (2020.01) |
| G02B 26/08 | (2006.01) |
| G02B 26/10 | (2006.01) |
| H05K 1/02 | (2006.01) |

(52) U.S. Cl.
CPC ........ G02B 26/0841 (2013.01); B81B 3/0018 (2013.01); G01S 7/4814 (2013.01); G01S 7/4817 (2013.01); G01S 17/931 (2020.01); G02B 26/105 (2013.01); H05K 1/0203 (2013.01); *B81B 2201/042* (2013.01)

(58) Field of Classification Search
CPC .. G02B 26/0841; G02B 26/105; G02B 7/008; G02B 26/0858; B81B 3/0018; B81B 2201/042; B81B 7/0054; G01S 7/4814; G01S 7/4817; G01S 17/931; H05K 1/0203; H05K 2201/09136; H05K 2201/09781; H05K 1/0271
USPC ........................................................ 356/5.01
See application file for complete search history.

(56) References Cited

U.S. PATENT DOCUMENTS

| | | |
|---|---|---|
| 7,907,019 B1 | 3/2011 | Brown |
| 8,331,005 B2 | 12/2012 | Burinskiy et al. |
| 10,755,995 B2 * | 8/2020 | Wang ................. H01L 23/3171 |
| 2004/0141682 A1 | 7/2004 | Mori |
| 2011/0174801 A1 | 7/2011 | Schwerman |
| 2014/0208838 A1 | 7/2014 | Moon et al. |
| 2016/0327220 A1 | 11/2016 | Tischler et al. |

(Continued)

*Primary Examiner* — Daniel L Murphy
(74) *Attorney, Agent, or Firm* — Kilpatrick Townsend & Stockton LLP

(57) ABSTRACT

A micro-electromechanical system (MEMS) apparatus has an array of micro-mirrors and a control circuit for rotating the micro-mirrors synchronously at a resonant frequency. The MEMS apparatus includes elements with different Coefficients of Thermal Expansion (CTE) for a die substrate coupled to the array of micro-mirrors, a die attach layer, a chip package coupled to the die substrate and a printed circuit board coupled to the chip package. The apparatus provides mechanisms for reducing changes in the resonant frequency due to changes in temperature causing stresses due to a mismatch between the CTE of the different elements. A thermoelectric cooler is used, along with the optional addition of heating resistors, additional pins to distribute stress, and the widened vias allowing room for the pins to bend and relieve stress on the chip package.

20 Claims, 20 Drawing Sheets

(56) References Cited

U.S. PATENT DOCUMENTS

2018/0077752 A1 3/2018 Lindley et al.
2018/0157029 A1 6/2018 Lemaire et al.
2019/0099290 A1 4/2019 Thomas et al.

* cited by examiner

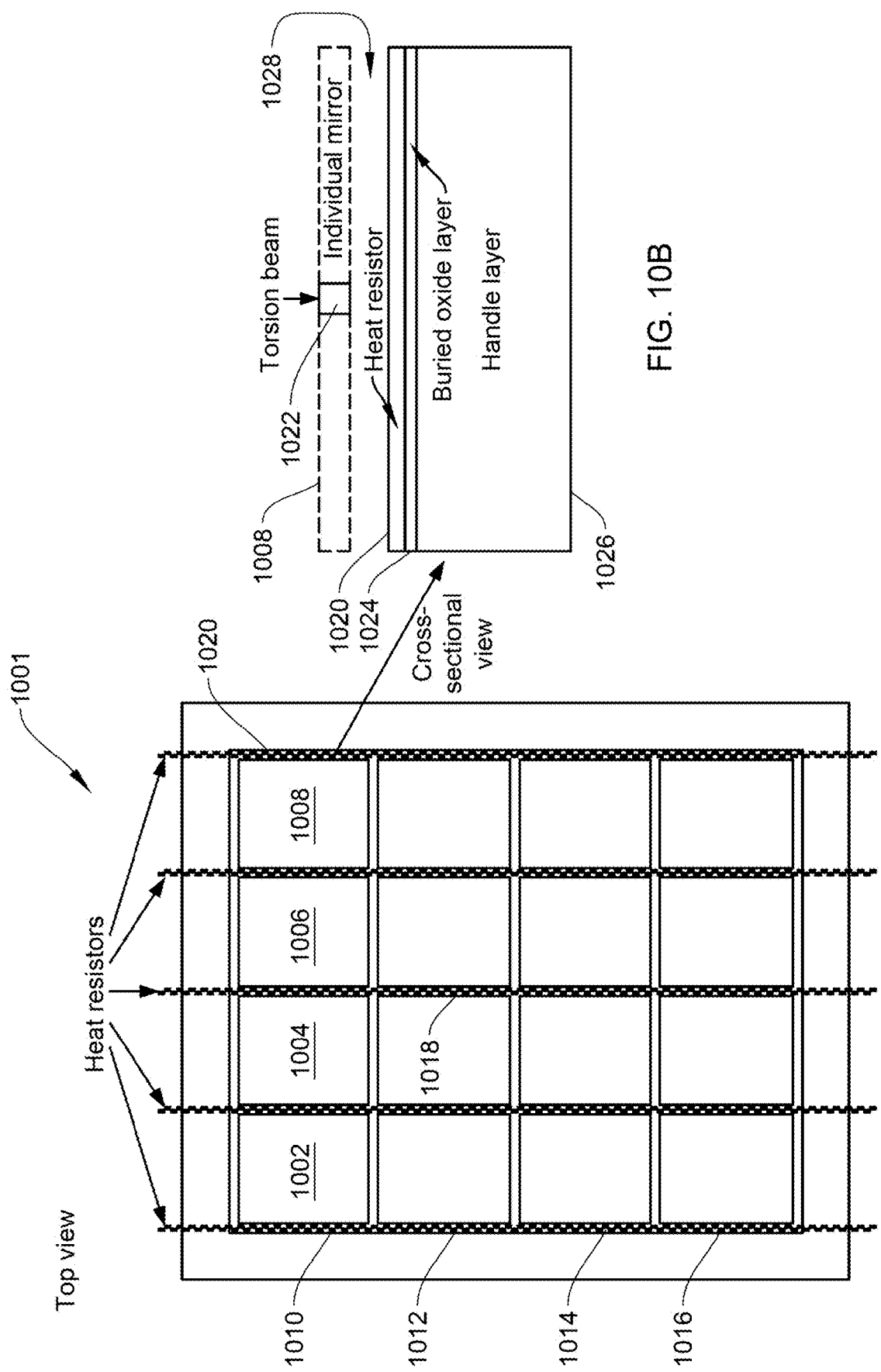

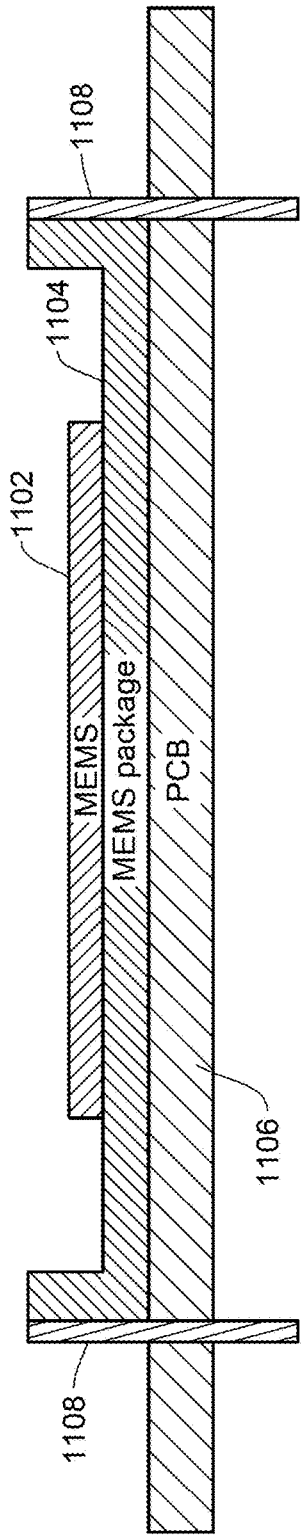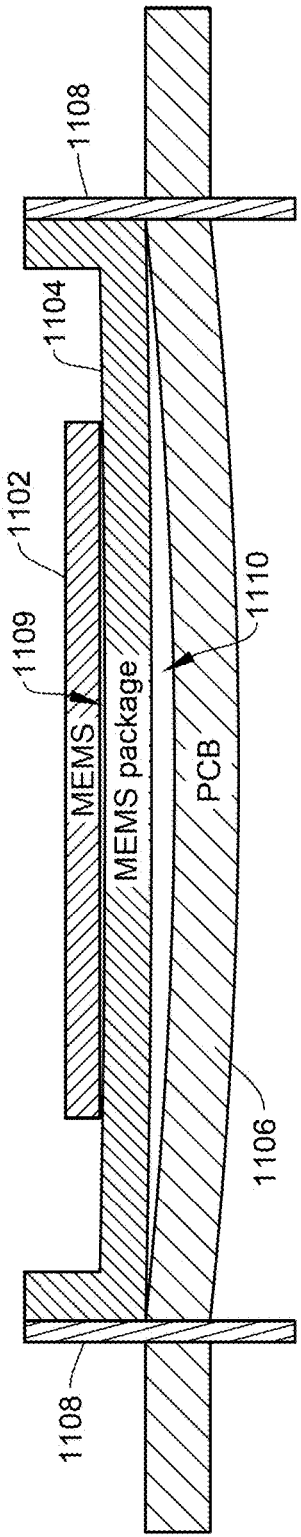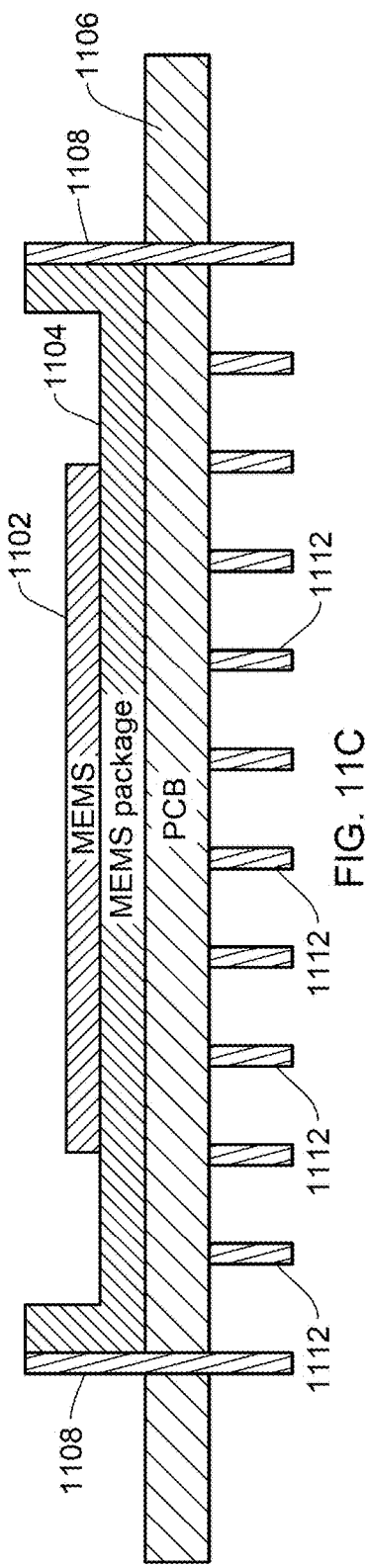

THERMAL CONTROL OF MEMS MIRRORS TO LIMIT RESONANT FREQUENCY SHIFT

BACKGROUND OF THE INVENTION

Unless otherwise indicated herein, the materials described in this section are not prior art to the claims in this application and are not admitted to be prior art by inclusion in this section. In particular, disparate technologies are discussed that it would not be obvious to discuss together absent the teachings of the present invention.

Modern vehicles are often equipped with sensors designed to detect objects and landscape features around the vehicle in real-time to enable technologies such as lane change assistance, collision avoidance, and autonomous driving. Some commonly used sensors include image sensors (e.g., infrared or visible light cameras), acoustic sensors (e.g., ultrasonic parking sensors), radio detection and ranging (RADAR) sensors, magnetometers (e.g., passive sensing of large ferrous objects, such as trucks, cars, or rail cars), and light detection and ranging (LiDAR) sensors.

A LiDAR system typically uses a light source and a light detection system to estimate distances to environmental features (e.g., pedestrians, vehicles, structures, plants, etc.). For example, a LiDAR system may transmit a light beam (e.g., a pulsed laser beam) to illuminate a target and then measure the time it takes for the transmitted light beam to arrive at the target and then return to a receiver near the transmitter or at a known location. In some LiDAR systems, the light beam emitted by the light source may be steered across a two-dimensional or three-dimensional region of interest according to a scanning pattern, to generate a "point cloud" that includes a collection of data points corresponding to target points in the region of interest. The data points in the point cloud may be dynamically and continuously updated, and may be used to estimate, for example, a distance, dimension, location, and speed of an object relative to the LiDAR system.

Light steering typically involves the projection of light in a pre-determined direction to facilitate, for example, the detection and ranging of an object, the illumination and scanning of an object, or the like. Light steering can be used in many different fields of applications including, for example, autonomous vehicles, medical diagnostic devices, etc., and can be configured to perform both transmission and reception of light. For example, a light steering transmitter may include a micro-mirror to control the projection direction of light to detect/image an object. Moreover, a light steering receiver may also include a micro-mirror to select a direction of incident light to be detected by the receiver, to avoid detecting other unwanted signals. A micro-mirror assembly typically includes a micro-mirror and an actuator. In a micro-mirror assembly, a micro-mirror can be connected to a substrate via a connection structure (e.g., a torsion bar, a spring, etc.) to form a pivot point. One such type of micro-mirror assembly can be a micro-electromechanical system (MEMS)-type structure that may be used for a light detection and ranging (LiDAR) system in an autonomous vehicle, which can be configured for detecting objects and determining their corresponding distances from the vehicle. LiDAR systems typically work by illuminating a target with an optical pulse and measuring the characteristics of the reflected return signal. The return signal is typically captured as a point cloud. The width of the optical-pulse often ranges from a few nanoseconds to several microseconds.

Micro-mirror devices used in a LIDAR system can be designed to operate (scan) at a resonant frequency of the MEMS mirror structure for larger scanning angles. The resonant frequency can be controlled by the design of the MEMS mirror structure and the supporting torsion springs that support them. By operating at the resonant frequency, the mirror can more easily be rotated, with less power, since it tends to resonate or oscillate at that frequency. This allows the achievement of a large scanning angle with a low operating voltage. When the surrounding temperature changes, stress develops at the interface between the device and its package, a die attach layer and a PCB because of a mismatch in CTE (coefficient of thermal expansion) of the various materials. The tension changes within the torsion springs coupled to the suspended micro-mirror. This results in a shift of the micro-mirror's resonant frequency, and related system components need to adapt to the new frequency. In addition to the frequency change, the tension between the micro-mirror and the package may also result in a bowed micro-mirror (ideally the micro-mirror or mirror array should be perfectly flat sitting on a silicon die substrate) and thus cause un-wanted light divergence. Accommodating for such temperature sensitivity can greatly increase the complexity of overall system.

Stress develops in the interface between the chip (die) and the package because of a mismatch in CTE (coefficient of thermal expansion) of the two materials. For example, a die could be mainly made of silicon and an enclosure could be a ceramic package which is made of alumina. The CTE of these two materials are different and they expand and contract at different rates with temperature. Alumina expands and contracts more than silicon, and thus stress develops at the interface of the two materials. This stress is transmitted to the devices in the substrate and can especially be noticeable in MEMS devices. In particular, such stresses can change the resonant frequency of a MEMS micro mirror with changes in temperature. Also, there may be inherent process variation during fabrication of microstructures. Achieving a target resonant frequency becomes especially important when multiple microstructures need to be operated together at the resonant frequency, such as an array of micro-mirrors. In order to achieve a large aperture, large die sizes are typically required. But due to the large die sizes, process uniformity within a single die becomes critical when all micro-mirrors are needed to be operated in sync. Any process non-uniformity across a wafer become more pronounced when die size increases. That would lead to variation in resonant frequency of individual micro-mirrors and operating them in synchronization would become more challenging.

BRIEF SUMMARY OF THE INVENTION

Embodiments of the present invention describe methods of controlling resonant frequency variation of MEMS micro-mirror(s) in a micro-mirror array due to fabrication non-uniformity and changing environmental conditions. In particular, embodiments provide a method and mechanism for reducing changes in the resonant frequency of a MEMS mirror structure with temperature.

In one embodiment, a micro-electromechanical system (MEMS) apparatus has an array of micro-mirrors and a control circuit for rotating the micro-mirrors synchronously at a resonant frequency. The MEMS apparatus includes elements with different Coefficients of Thermal Expansion (CTE) for at least a die substrate coupled to the array of micro-mirrors, a chip package coupled to the die substrate and a printed circuit board coupled to the chip package. The apparatus provides mechanisms for reducing changes in the resonant frequency due to changes in temperature (causing stresses due to a mismatch between the CTE of the different elements).

In a further embodiment, a thermoelectric cooler (TEC) is mounted in or near the chip package. A temperature sensor (e.g., a thermistor) is mounted near the chip package for detecting a temperature of the array of micro-mirrors. The TEC is controlled to heat or cool the array of micro-mirrors when a detected temperature varies enough to change the resonant frequency of the array of micro-mirrors.

In another embodiment, at least one temperature control element is mounted near the array of micro-mirrors. A temperature control circuit is coupled to the temperature sensor and at least one temperature control element. The temperature control element is activated in response to a change in temperature that will change the resonant frequency due to changes in temperature (causing stresses due to a mismatch between the CTE of the different elements).

In further embodiments, the temperature control element includes an array of heating resistors used to heat different portions of the array of micro-mirrors differently to account for different changes in resonant frequency depending on the location of an individual micro-mirror. In particular, this can compensate for different spring constants of torsion bars supporting micro-mirrors near the edge of the array compared to the central portion of the array.

Additionally, embodiments can also provide a plurality of additional pins attached to the chip package for adding rigidity to the chip package. The added rigidity minimizes bending due to changes in temperature that cause stresses and bending due to differences in the CTE of the MEMS micro-mirror array substrate, the die attach bonding layer, the chip package and the PCB. In another embodiment, a plurality of vias provide bending space for a plurality of pins attached to the chip package. Thus, as the chip package expands or contracts with temperature, the pins move with the chip package, minimizing stresses that would affect the resonant frequency of the MEMS micro-mirror array.

Different embodiments use different combinations of the thermoelectric cooler, the heating resistors, the additional pins, and the widened vias for the pins. For example, one embodiment only uses the thermoelectric cooler. Another embodiment uses both the thermoelectric cooler and the heating resistors. Yet another embodiment uses the thermoelectric cooler, the heating resistors and the additional pins. Another embodiment uses the thermoelectric cooler, the heating resistors, the additional pins, and the widened vias for the pins. A different embodiment uses the heating resistors, the additional pins, and the widened vias for the pins. Additional embodiments can use any combination of these elements.

Other embodiments provide a method for controlling the resonant frequency of an array of micro-mirrors in a microelectromechanical system (MEMS) mirror chip. The method includes providing a die substrate coupled to an array of micro-mirrors, a chip package coupled to the die substrate and a printed circuit board coupled to the chip package, all having different CTEs. The steps include rotating the array of micro-mirrors synchronously at a resonant frequency, detecting a temperature proximate the array of micro-mirrors and controlling the temperature of the array of micro-mirrors in response to detecting a variation in temperature that will change the resonant frequency (due to changes in temperature causing stresses due to a mismatch between the CTEs).

The terms and expressions that have been employed are used as terms of description and not of limitation, and there is no intention in the use of such terms and expressions to exclude any equivalents of the features shown and described or portions thereof. It is recognized, however, that various modifications are possible within the scope of the systems and methods claimed. Thus, it should be understood that, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

The features of the various embodiments described above, as well as other features and advantages of certain embodiments of the present invention, will be more apparent from the following detailed description taken in conjunction with the accompanying drawings, in which:

FIGS. 10A-10B are diagrams of an array of heating resistors according to an embodiment;

FIG. 11A is a cross-sectional view of a MEMS mirror array mounted in a MEMS package on a PCB in one embodiment;

FIG. 11B shows the effect of variation in temperature with a CTE mismatch on the structure of FIG. 11A according to certain embodiments;

FIG. 11C illustrates the structure of FIGS. 11A-B with additional pins according to an embodiment;

DETAILED DESCRIPTION OF THE INVENTION

Figure 1:
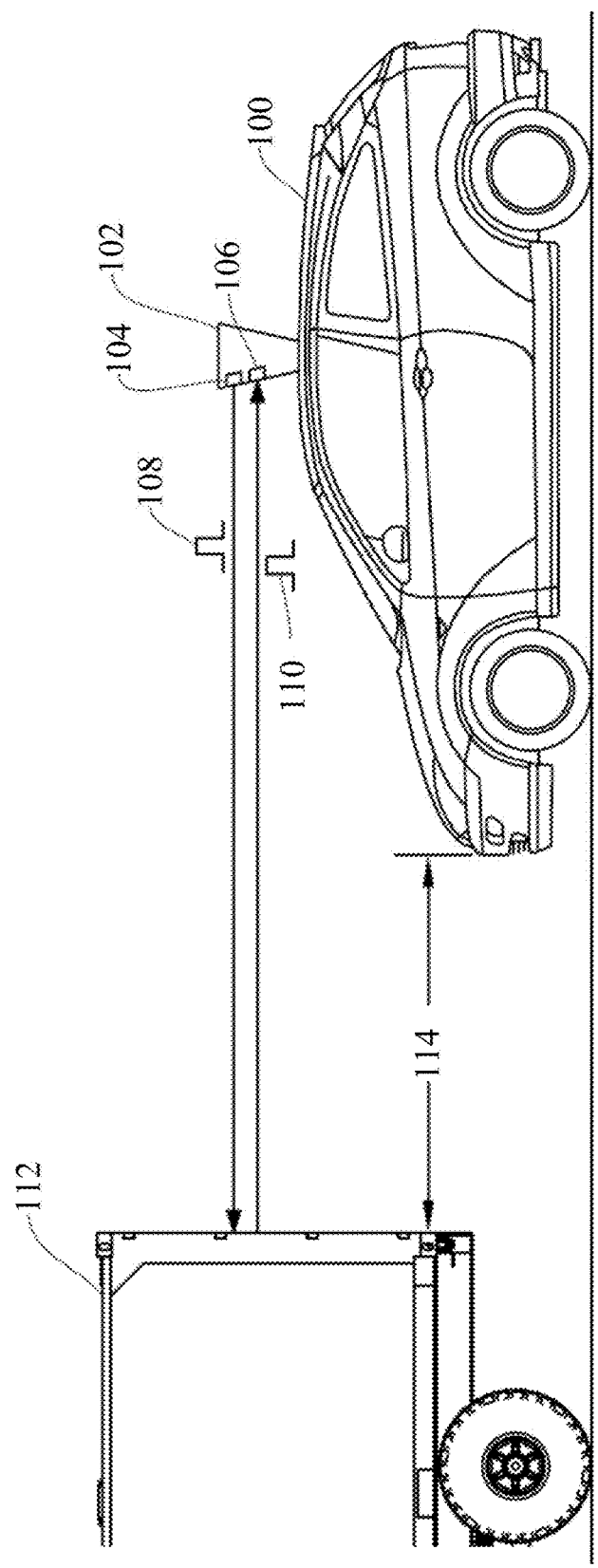
FIG. 1 shows an autonomous vehicle with a LiDAR system, according to certain embodiments.

Aspects of the present disclosure relate generally to a LiDAR system, and more particularly to scanning an environment with a laser and MEMS-based mirrors, and in particular to minimizing the effect of temperature changes on the MEMS mirrors resonant frequency.

In the following description, various examples of MEMS-based micro mirror structures are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

The following high level summary is intended to provide a basic understanding of some of the novel innovations depicted in the figures and presented in the corresponding descriptions provided below. Techniques disclosed herein relate generally to microelectromechanical (MEMS) mirrors that can be used in, for example, light detection and ranging (LiDAR) systems or other light beam steering systems. More specifically, and without limitation, disclosed herein are embodiments that provide a micro-electromechanical system (MEMS) method and mechanism that minimizes the effect of temperature changes on the resonant frequency by controlling the temperature of the MEMS micro-mirrors.

In summary, embodiments of the present invention described in the figures referenced below provide a micro-electromechanical system (MEMS) apparatus for beam steering in a Light Detection and Ranging (LiDAR) system 102 of an autonomous vehicle 100. A mirror 304 is supported by torsion springs 302. An array of such mirrors are provided. A control circuit 722 controls rotating the mirrors at a resonant frequency. Provided is a means (612, 703, 1112, 1509) for reducing changes in the resonant frequency due to changes in temperature causing stresses (due to a mismatch between the CTEs of die substrate 322, chip package 604 and printed circuit board 606).

Different means for reducing changes in the resonant frequency due to changes in temperature are provided as separate embodiments or in different combinations. These include thermoelectric cooler (TEC) 612, heating resistors 703, additional support pins 1112 and widened vias 1509 to allow pin bending with stresses due to temperature change.

In one embodiment, an architecture is provided where a thermoelectric cooler (TEC) 612 is mounted proximate the MEMS mirrors. The thermoelectric cooler (TEC) consists of a TEC heatsink 706 and a TEC controller 712. The TEC heatsink 706 can optionally be mounted either inside or outside of the MEMS mirror array 702 module package. A thermistor 704 is placed close to the MEMS mirror array 702 to sense the MEMS mirror array temperature. The temperature information will be read out from the thermistor and sent to a temperature controller 716. The temperature controller 716 compares the sensed temperature and a temperature set point (e.g., a target temperature for the resonant frequency), and then generates the appropriate TEC control output to control the TEC controller 712.

In one embodiment, an architecture is provided where heating resistors are integrated on a MEMS mirror array structure at strategic locations to provide a fine-tuning of resonant frequency of individual micro-mirrors or groups of micro-mirrors on the die. These heating resistors could also be controlled together to compensate for environmental changes or be controlled independently to compensate for stress mismatches that could happen among individual micro mirrors in a micro-mirror array due to design limitations, fabrication non-uniformity or stress gradient. For instance, the spring constant of hinges of micro-mirrors at both ends of the array could be lower without design optimization, leading to synchronization issues. With information gathered from a feedback mechanism for determining the operational state of the MEMS array, the heating resistors can be controlled to provide a target resonant frequency and better synchronization.

The detailed discussion below, and accompanying figures, will first describe a general LiDAR system incorporating embodiments. Next, the mirror structure that operates at a resonant frequency is described. That is followed by detailed descriptions of the novel MEMS mirror temperature control mechanisms. Next are descriptions of the control systems that can react to the change in resonant frequency with temperature, and the computer systems for controlling the systems.

Generally, aspects of the invention are directed to implementations of light steering, which can be used in a number of different applications. For example, a Light Detection and Ranging (LiDAR) module of an autonomous vehicle may incorporate a light steering system. The light steering system can include a transmitter and receiver system to steer emitted incident light in different directions around a vehicle, and to receive reflected light off of objects around the vehicle using a sequential scanning process, which can be used to determine distances between the objects and the vehicle to facilitate autonomous navigation.

Light steering can be implemented by way of micro-mirror assemblies as part of an array, with each micro-mirror assembly having a movable micro-mirror and an actuator (or multiple actuators). The micro-mirrors and actuators can be formed as microelectromechanical systems (MEMS) on a semiconductor substrate, which allows for the integration of the MEMS with other circuitries (e.g., controller, interface circuits, etc.) on the semiconductor substrate, which can allow for simpler, easier, more robust, and cost-effective manufacturing processes.

In a micro-mirror assembly, a micro-mirror can be mechanically connected (e.g., "anchored") to the semiconductor substrate via a connection structure (e.g., torsion bar, torsion spring, torsion beam, etc.) to form a pivot point and an axis of rotation. As described herein, "mechanically connected," or "connected," can include a direct connection or an indirect connection. For example, the micro-mirror can be indirectly connected to the substrate via a connection structure (e.g., torsion bar or torsion spring) to form a pivot/connection point. The micro-mirror can be rotated around the pivot/connection point ("referred to herein as a pivot point") on the axis of rotation by an actuator. An electrostatic actuator is typically used; however, any suitable type of actuator may be implemented (e.g., piezoelectric, thermal mechanical, etc.), and one of ordinary skill in the art with the benefit of this disclosure would appreciate the many modifications, combinations, variations, and alternative embodiments thereof.

In some embodiments, each micro-mirror can be configured to be rotated by a rotation angle or moved vertically to reflect (and steer) light towards a target direction. For rotation, the connection structure can be deformed to accommodate the rotation, but the connection structure also has a degree of spring stiffness, which varies with the rotation angle and counters the rotation of the micro-mirror to set a target rotation angle. To rotate a micro-mirror by a target rotation angle, an actuator can apply a torque to the micro-mirror based on the rotational moment of inertia of the mirror, as well as the degree of spring stiffness for a given target rotation angle. Different torques can be applied to rotate (e.g., oscillate) the micro-mirror at or near a resonant frequency to achieve different target rotation angles. The actuator can then remove the torque, and the connection structure can return the micro-mirror back to its default orientation for the next rotation. A vertical actuator, such as an electrostatic force actuator, or a thermal actuator with a piston, can be used in embodiments. The rotation or vertical displacement of the micro-mirror can be repeated in the form of an oscillation, typically at or near a resonant frequency of the micro-mirror based on the mass of the micro-mirror and the spring constant of the connection structure.

One of ordinary skill in the art with the benefit of this disclosure would appreciate the many implementations and alternative embodiments thereof.

Typical System Environment for Certain Embodiments of the Invention

FIG. 1 illustrates an autonomous vehicle 100 in which the various embodiments described herein can be implemented. Autonomous vehicle 100 can include a LiDAR module 102. LiDAR module 102 allows autonomous vehicle 100 to perform object detection and ranging in a surrounding environment. Based on the result of object detection and ranging, autonomous vehicle 100 can drive according to the rules of the road and maneuver to avoid a collision with detected objects. LiDAR module 102 can include a light steering transmitter 104 and a receiver 106. Light steering transmitter 104 can project one or more light signals 108 at various directions (e.g., incident angles) at different times in any suitable scanning pattern, while receiver 106 can monitor for a light signal 110 which is generated by the reflection of light signal 108 by an object. Light signals 108 and 110 may include, for example, a light pulse, a frequency modulated continuous wave (FMCW) signal, an amplitude modulated continuous wave (AMCW) signal, etc. LiDAR module 102 can detect the object based on the reception of light signal 110, and can perform a ranging determination (e.g., a distance of the object) based on a time difference between light signals 108 and 110, as would be appreciated by one of ordinary skill in the art with the benefit of this disclosure. For example, as shown in FIG. 1, LiDAR module 102 can transmit light signal 108 at a direction directly in front of autonomous vehicle 100 at time T1 and receive light signal 110 reflected by an object 112 (e.g., another vehicle) at time T2. Based on the reception of light signal 110, LiDAR module 102 can determine that object 112 is directly in front of autonomous vehicle 100. Moreover, based on the time difference between T1 and T2, LiDAR module 102 can also determine a distance 114 between autonomous vehicle 100 and object 112. Autonomous vehicle 100 can thereby adjust its speed (e.g., slowing or stopping) to avoid collision with object 112 based on the detection and ranging of object 112 by LiDAR module 102.

Figure 2A:
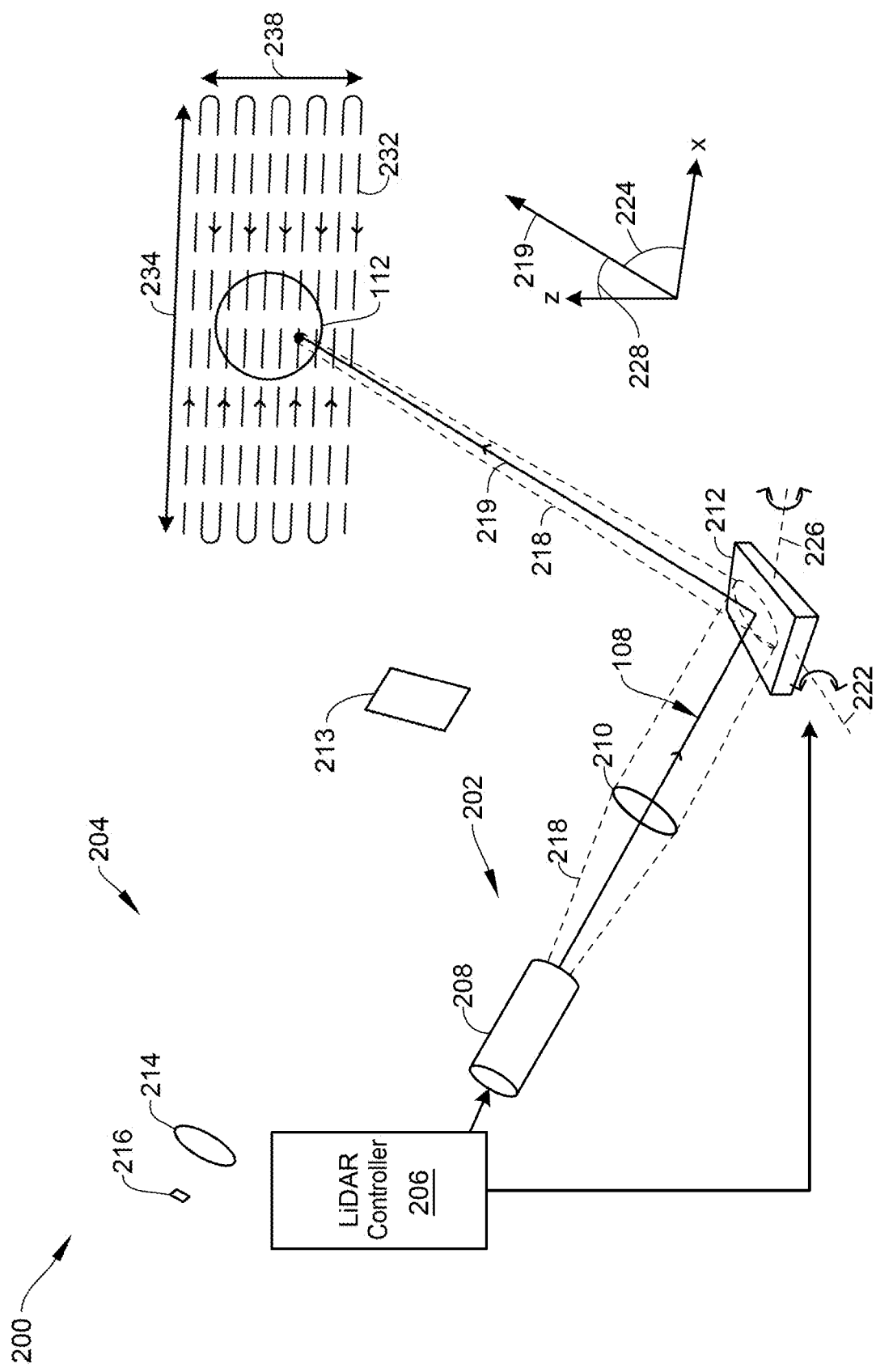
FIG. 2A shows an example of a light projection operation, according to certain embodiments.
Figure 2B:
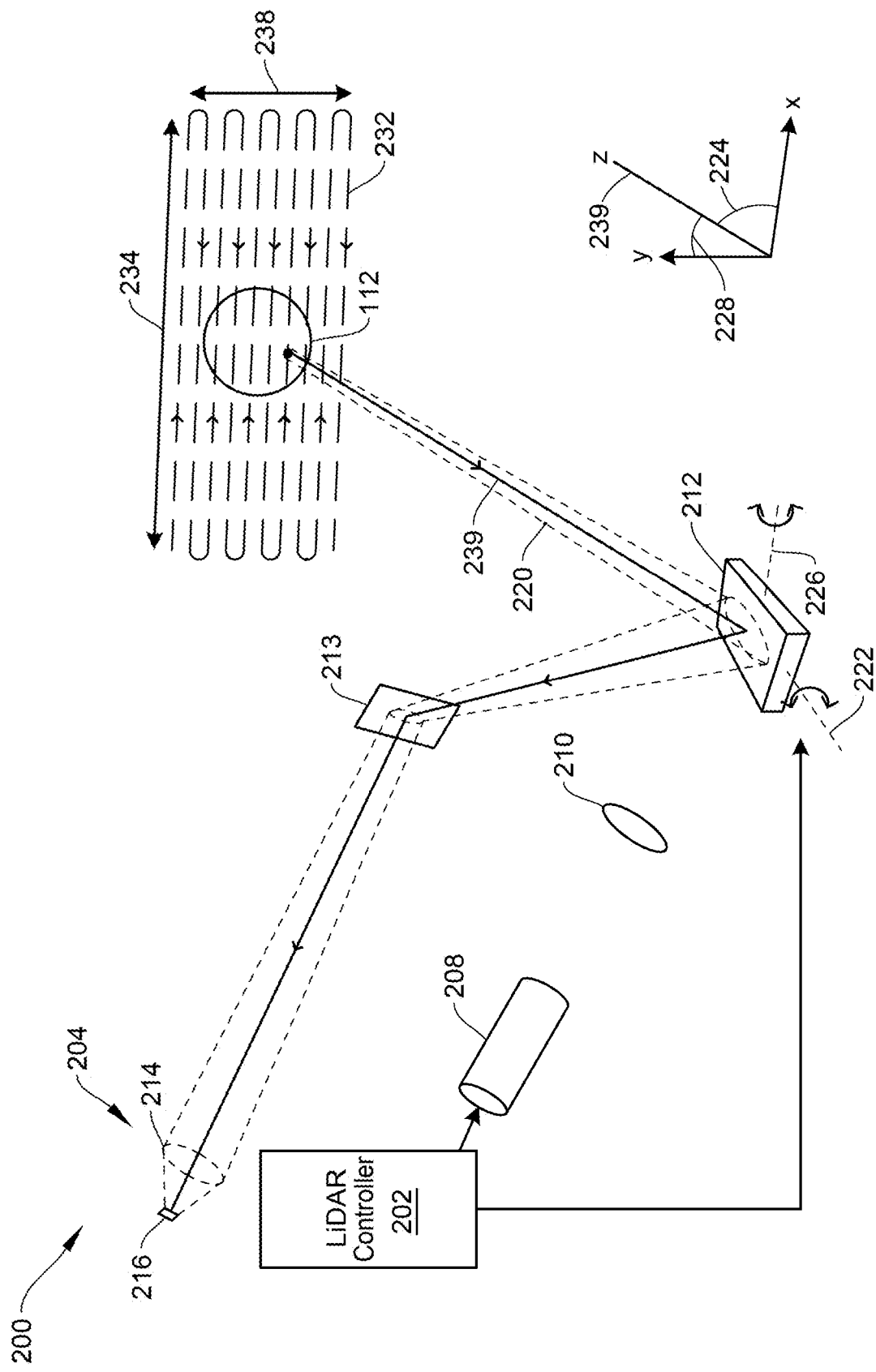
FIG. 2B shows an example of a light detection operation, according to certain embodiments.

FIG. 2A and FIG. 2B illustrate simplified block diagrams of an example of a LiDAR module 200 according to certain embodiments. LiDAR module 200 may be an example of LiDAR system 102, and may include a transmitter 202, a receiver 204, and LiDAR controller 206, which may be configured to control the operations of transmitter 202 and receiver 204. Transmitter 202 may include a light source 208 and a collimator lens 210, and receiver 204 can include a lens 214 and a photodetector 216. LiDAR module 200 may further include a mirror assembly 212 (also referred to as a "mirror structure") and a beam splitter 213. In some embodiments, LiDAR module 102, transmitter 202 and receiver 204 can be configured as a coaxial system to share mirror assembly 212 to perform light steering operations, with beam splitter 213 configured to reflect incident light reflected by mirror assembly 212 to receiver 204.

FIG. 2A shows an example of a light projection operation, according to certain embodiments. To project light, LiDAR controller 206 can control light source 208 (e.g., a pulsed laser diode, a source of FMCW signal, AMCW signal, etc.) to transmit light signal 108 as part of light beam 218. Light beam 218 can disperse upon leaving light source 208 and can be converted into collimated light beam 218 by collimator lens 210. Collimated light beam 218 can be incident upon a mirror assembly 212, which can reflect collimated light beam 218 to steer it along an output projection path 219 towards object 112. Mirror assembly 212 can include one or more rotatable mirrors. FIG. 2A illustrates mirror assembly 212 as having one mirror; however, a micro-mirror array may include multiple micro-mirror assemblies that can collectively provide the steering capability described herein. Mirror assembly 212 can further include one or more actuators (not shown in FIG. 2A) to rotate the rotatable mirrors. The actuators can rotate the rotatable mirrors around a first axis 222, and can rotate the rotatable mirrors along a second axis 226. The rotation around first axis 222 can change a first angle 224 of output projection path 219 with respect to a first dimension (e.g., the x-axis), whereas the rotation around second axis 226 can change a second angle 228 of output projection path 219 with respect to a second dimension (e.g., the z-axis). LiDAR controller 206 can control the actuators to produce different combinations of angles of rotation around first axis 222 and second axis 226 such that the movement of output projection path 219 can follow a scanning pattern 232. A range 234 of movement of output projection path 219 along the x-axis, as well as a range 238 of movement of output projection path 219 along the z-axis, can define a FOV. An object within the FOV, such as object 112, can receive and reflect collimated light beam 218 to form reflected light signal, which can be received by receiver 204 and detected by the LiDAR module, as further described below with respect to FIG. 2B. In certain embodiments, mirror assembly 212 can include one or more comb spines with comb electrodes (see, e.g., FIG. 3), as will be described in further detail below.

FIG. 2B shows an example of a light detection operation, according to certain embodiments. LiDAR controller 206 can select an incident light direction 239 for detection of incident light by receiver 204. The selection can be based on setting the angles of rotation of the rotatable mirrors of mirror assembly 212, such that only light beam 220 propagating along light direction 239 gets reflected to beam splitter 213, which can then divert light beam 220 to photodetector 216 via collimator lens 214. With such arrangements, receiver 204 can selectively receive signals that are relevant for the ranging/imaging of object 112 (or any other object within the FOV), such as light signal 110 generated by the reflection of collimated light beam 218 by object 112, and not to receive other signals. As a result, the effect of environmental disturbance on the ranging and imaging of the object can be reduced, and the system performance may be improved.

Mirror Structure

Figure 3A:
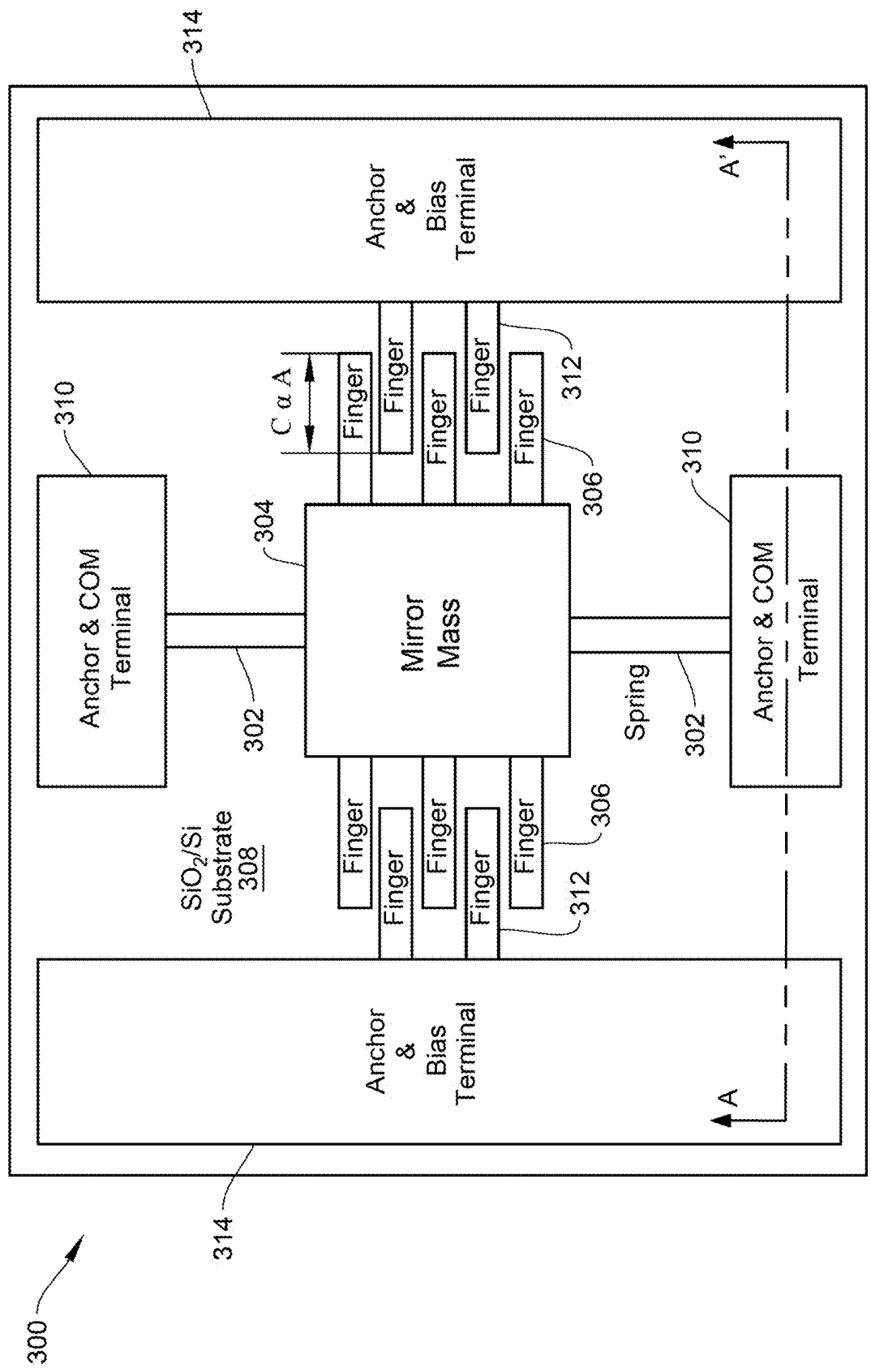
FIG. 3A is a diagram of the structure of a MEMS mirror according to certain embodiments.

FIG. 3A is a diagram of the structure of a MEMS mirror. FIG. 3A shows a typical electrostatic MEMS mirror structure 300 with springs (torsion beams) 302, a mirror mass 304, and comb fingers 306, 312. The mirror mass 304 is suspended by mechanical springs or torsion beams 302 which are typically anchored in a SiO$_2$/silicon substrate 308 and anchored at anchor and COM (sometimes referred to as simply "common" or "COM") terminals 310. Comb fingers 306 are connected to mirror mass 304, and are interleaved with comb fingers 312 connected to anchor and bias (sometimes referred to as simply "bias") terminals 314. Terminals 310 provide for common (COM) with the mirror, both providing a driving voltage and sensing a change in capacitance between the fingers 306 connected to mirror mass 304, and interleaved fingers 312 connected to anchor and bias terminals 314. Anchor and bias terminals 314 are connected to a voltage bias, which is typically a combination of a DC and an AC voltage.

As shown, this structure allows rotation around the axis of the springs/torsion beams 302. In another embodiment not shown in order to not complicate the diagram, additional springs can be provided to give a second, orthogonal axis of rotation of the mirror mass 304 (See FIG. 8 and the accompanying discussion below). Additional interleaved comb fingers are then provided, connected to separate bias and COM anchor terminals.

Figure 3B:
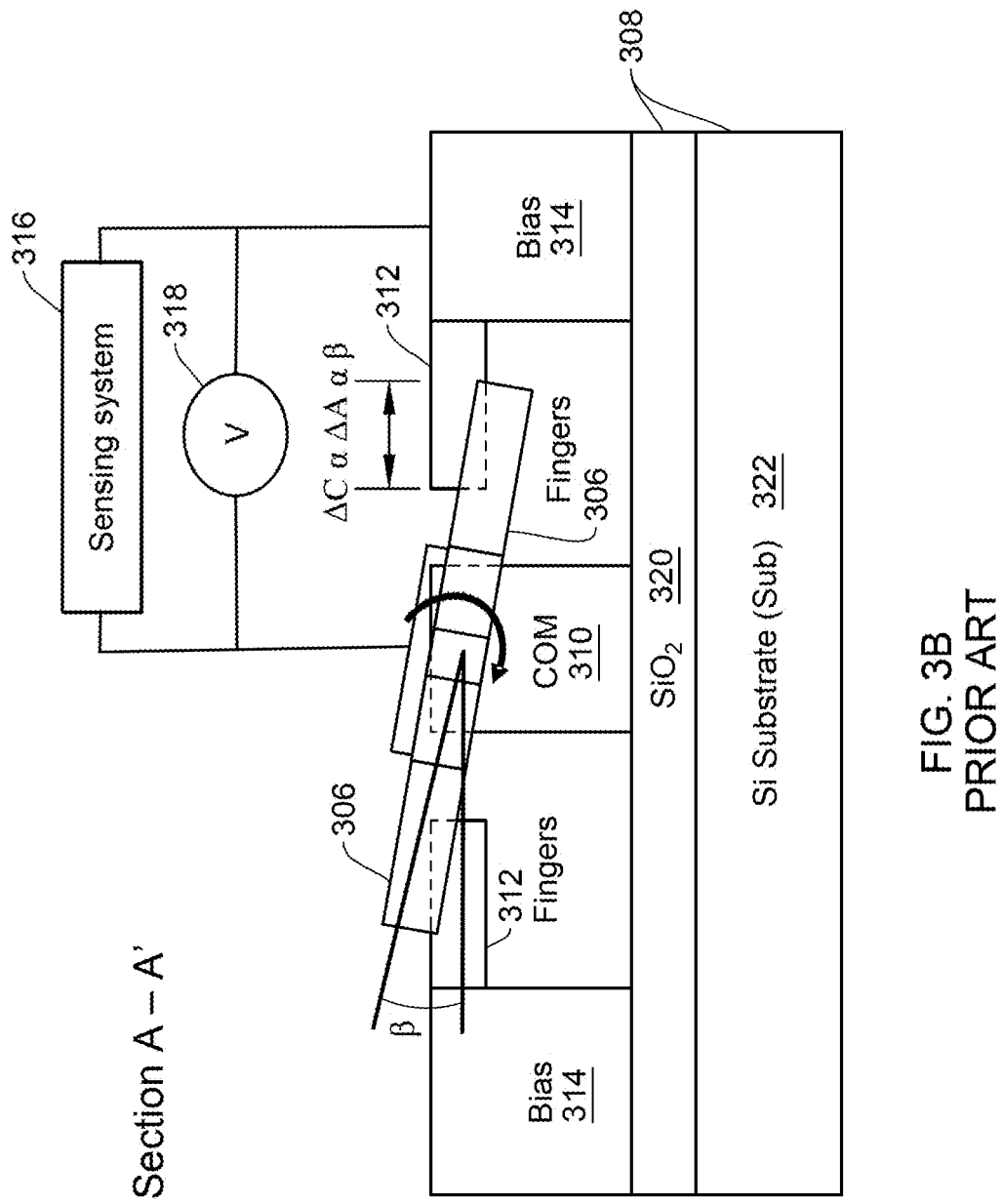
FIG. 3B is a sectional view of FIG. 3A along lines A-A according to certain embodiments.

FIG. 3B is a sectional view of FIG. 3A along lines A-A. As can be seen from FIG. 3B, mirror mass 304 tilts when a driving voltage 318 (V) is applied across the comb fingers 306, 312, between COM terminal 310 and bias terminal 314. Since the overlap area in the fingers changes along with the mirror mass displacement, the capacitance of the comb fingers changes proportionally and it is sensed by sensing system 316 and used as feedback to control the motion of the mirror mass. As shown, the overlap between the fingers 306 and 312 changes, with a change in capacitance ($\Delta C$) that is proportional to the change in overlap area ($\Delta A$), which is proportional to the tilt angle $\beta$.

Figure 3C:
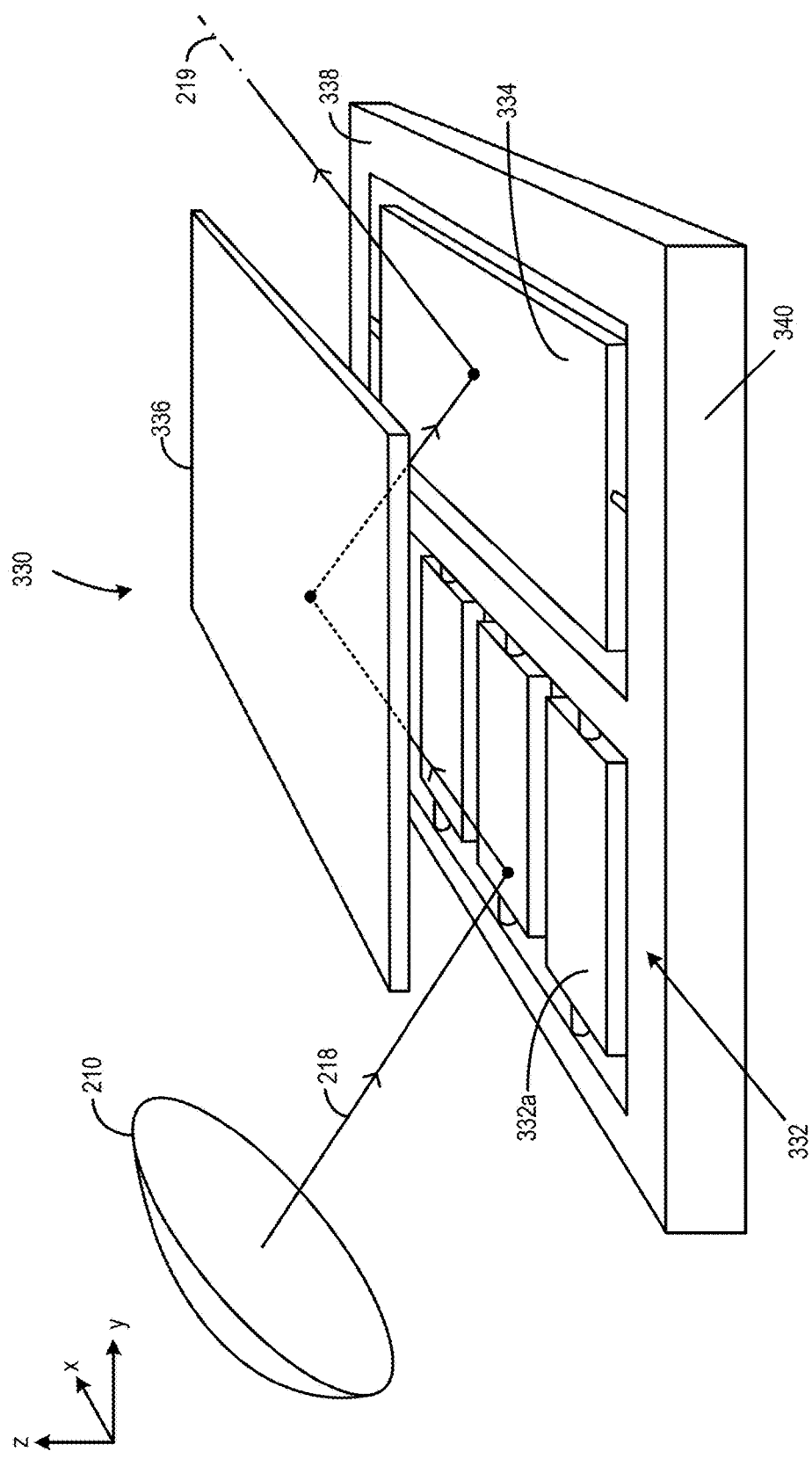
FIG. 3C illustrates an example of a mirror array assembly, according to embodiments.

FIG. 3C illustrates an example of a mirror array assembly 330, according to embodiments of the present disclosure. Mirror array assembly 330 can be part of light steering system 202. FIG. 3B illustrates a perspective view of mirror array assembly 330. As shown in FIG. 3C, mirror assembly 330 can include an array of first rotatable mirrors 332, a second rotatable mirror 334, and a stationary mirror 336. The total mirror surface area of the array of first rotatable mirrors 332 is identical to the mirror surface area of second rotatable mirror 334 and of stationary mirror 336. The array of first rotatable mirrors 332 and second rotatable mirror 334 can be MEMS devices implemented on a surface 338 of a semiconductor substrate 340. Stationary mirror 336 can be positioned above semiconductor substrate 340. In some embodiments, stationary mirror 336 can be included within the same integrated circuit package as semiconductor substrate 340 to form an integrated circuit. In some embodiments, stationary mirror 336 can also be positioned external to the integrated circuit package that houses semiconductor substrate 340.

Referring to FIG. 3C, in one configuration, array of first rotatable mirrors 332 can receive collimated light beam 218 from collimator lens 210, reflect the light beam 218 towards stationary mirror 336, which can reflect the light beam 218 towards second rotatable mirror 334. Second rotatable mirror 334 can reflect light beam 218 received from stationary mirror 336 as an output along output projection path 219. In another configuration (not shown in the figures), second rotatable mirror 334 can receive collimated light beam 218 from collimator lens 210 and reflect the light beam 218 towards stationary mirror 336, which can reflect the light beam 218 towards array of first rotatable mirrors 332. Array of first rotatable mirrors 332 can reflect light beam 218 as an output along output projection path 219. In a case where mirror assembly 330 is part of the receiver, the array of first rotatable mirrors 332 and second rotatable mirror 334 can also select incident light direction 239 as shown in FIG. 2B for receiver 204 similar to the selection of direction of output projection path 219. Array of first rotatable mirrors 332 and second rotatable mirror 334 change an angle of output projection path 219 with respect to, respectively, the x-axis and the z-axis, to form a two-dimensional FOV.

As described above, the total mirror surface area of the array of first rotatable mirrors 332 is identical to the mirror surface area of second rotatable mirror 334 and of stationary mirror 336. Moreover, each dimension (e.g., length and width) of the mirror surface area provided by each of the array of first rotatable mirrors 332, second rotatable mirror 334, and stationary mirror 336 can match aperture length 220 of collimator lens 210. With such arrangements, each of the array of first rotatable mirrors 332, second rotatable mirror 334, and stationary mirror 336 can receive and reflect a majority portion of collimated light beam 218. Alternately, the mirror sizes can vary, such as mirrors 334 and 336 being slightly larger than array of first rotatable mirrors 332 to insure capture of all reflected light at the edges.

CTE Mismatch

A MEMS device typically has a slight difference in the coefficient of thermal expansion (CTE) among at least four materials: the MEMS die, chip package, die attach layer (epoxy or film) and PCB. When environmental temperature changes, those four materials would expand and contract at slightly different rates and that differences would lead to stress which causes slight bowing of the components and shifting of the resonant frequency of the MEMS micro mirror(s). The MEMS die would typically have the smallest CTE of the group. Thus, the die attach material in one embodiment is chosen to have a low Young's modulus to minimize the stress caused by the CTE mismatch of the MEMS die and the package. That primarily leaves thermal expansion mismatch among the MEMS die, the package and the PCB. By controlling that mismatch, the resonant frequency and divergence of the MEMS micro mirror(s) could be controlled to maintain stability.

Assuming a target resonant frequency of MEMS micro mirror(s) is achieved at room temperature, a chip package would expand more than a MEMS die when the temperature is elevated. That would typically lead to compressive stress on the MEMS die and would decrease the resonant frequency of the micro mirror(s). When the temperature is reduced, the opposite would happen and the resonant frequency of the micro mirror(s) would typically increase. When the package is assembled on a PCB, the effect of the temperature change is enhanced as the PCB typically has even greater CTE.

When there is resonant frequency variation of individual micro-mirrors across a micro-mirror array, achieving synchronization during operation becomes a challenge. Even with mechanical links used to help synchronization of the micro-mirrors' movements, desynchronization could happen with a slight change in operation frequency. Similarly, when the micro-mirrors' movement is desynchronized, it could again be synchronized by changing the operation frequency.

Figure 4A:
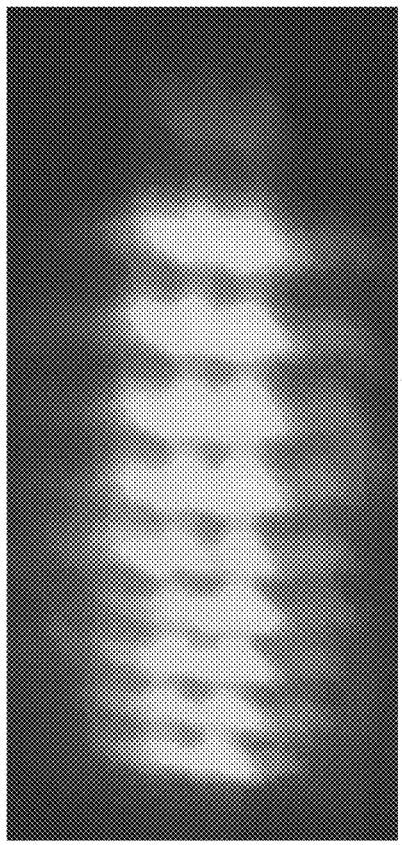
FIG. 4A is an image that shows a near-field pattern of a beam reflected off an operating MEMS micro-mirror array at a resonant frequency moving in synchronization, according to certain embodiments.

Typically the mirrored surfaces of a MEMS micro-mirror array would have less than full coverage of reflective area. While the micro-mirrors moving in synchronization would be directing a light beam to a particular direction at one point in time, surfaces of other moving and non-moving parts such as torsion beams, comb drives and mechanical links connecting micro-mirrors' movements together would probably be pointing toward other directions. Thus, those structures would typically be treated to create a surface to minimize reflection towards unintended directions. One such treatment is the application of multiple dielectric layers, such that the combined refraction of light hitting the diffractive layers directs the light in a different direction than the mirrored surfaces or causes the light to be absorbed and not reflected. When used with a light source with low divergence, the reflected beam off a MEMS micro-mirror array moving in synchronization would then have a distinctly visible pattern showing the pattern of the reflective area of the MEMS micro-mirror array, with gaps between the light reflecting (mirror) portions corresponding to the non-reflective surfaces. FIG. 4A shows an image of a near-field pattern of a beam reflected off an operating MEMS micro-mirror array moving in synchronization.

Figure 4B:
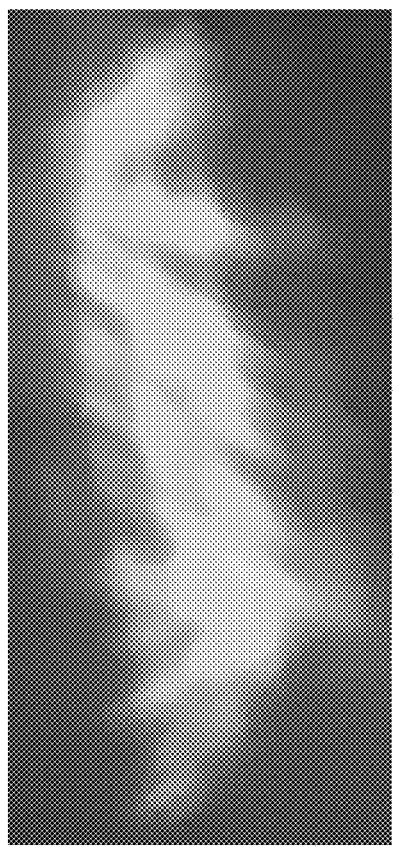
FIG. 4B is the image of FIG. 4A when the micro-mirrors are not moving in synchronization, according to certain embodiments.

If the micro-mirrors are not moving in synchronization, the visible pattern becomes skewed and would be vastly different from the pattern of the MEMS micro-mirror array as shown in FIG. 4B.

Figure 5:
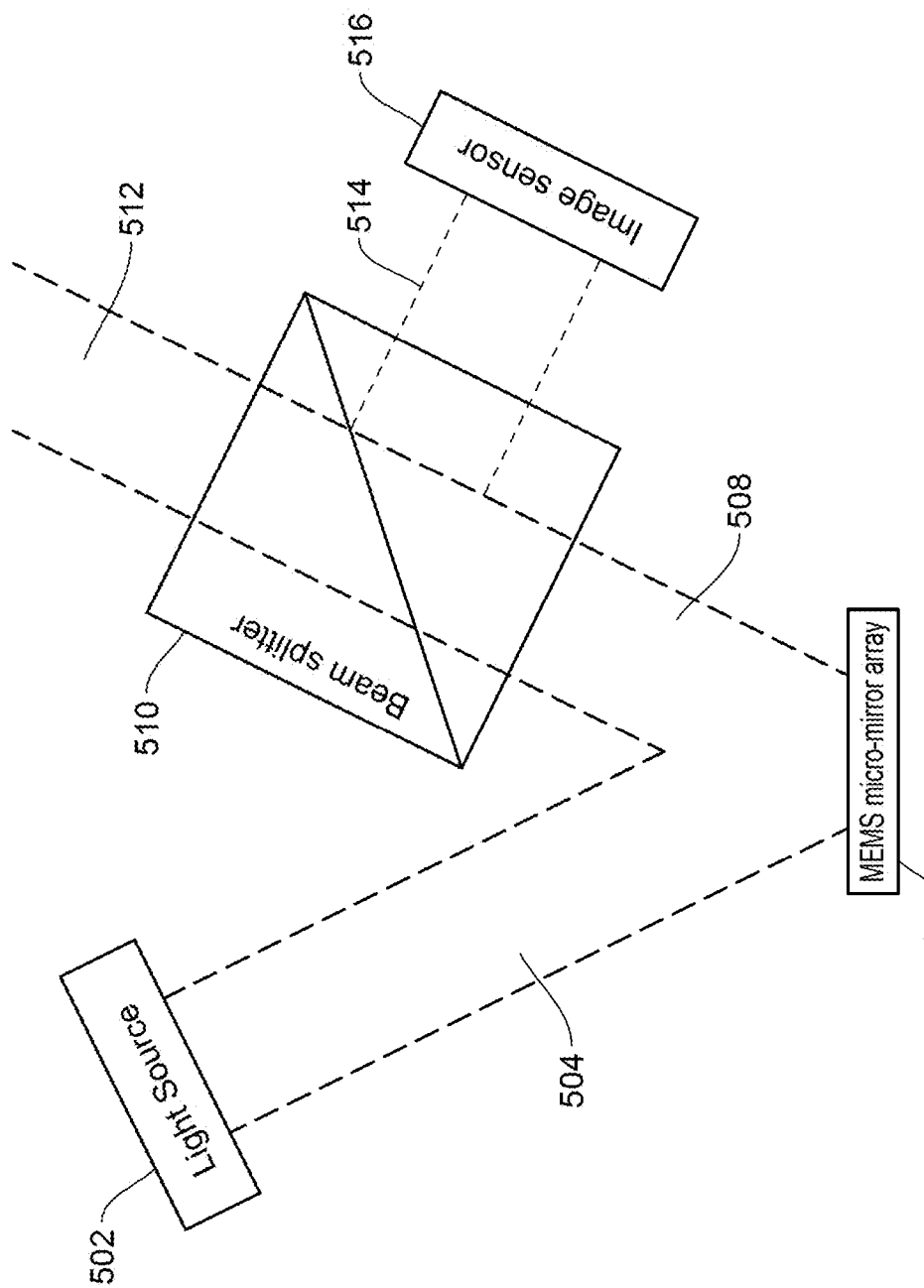
FIG. 5 is a diagram of an arrangement for detecting the patterns of FIGS. 4A and 4B according to certain embodiments.

The patterns of FIGS. 4A and 4B can be detected using an arrangement such as set forth in FIG. 5. A light source 502 provides a collimated beam 504 of light. This light source may be reflected light off an environment or target. Beam 504 reflects off a MEMS micro-mirror array 506 providing a reflected beam 508. Most of reflected beam 508 passes through a beam splitter 510 and exits as beam 512, which proceeds to a detector. A small portion of beam 508 is redirected by beam splitter 510 as a beam 514 which is directed to an image sensor 516. Image sensor 516 produces the patterns shown in FIGS. 4A and 4B.

The arrangement of FIG. 5 may be used in a test environment to determine an initial resonant frequency, or resonant frequencies for different temperatures. The resonant frequency can be adjusted, as discussed below, until the pattern indicates a resonant frequency has been achieved for a particular temperature, as measured by a thermistor, for example, as discussed below. That temperature for that resonant frequency will then be stored as the target temperature for control of production parts. Alternately, or additionally, a table of temperatures versus resonant frequencies could be established, and used later to vary the resonant frequency based on the detected temperature.

Alternately, a pattern recognition architecture can in incorporated into a production light scanning system with a MEMS micro-mirror array to determine if the movement of the micro-mirrors are in synchronization. The image from image sensor 516 is fed to pattern recognition software which is integrated into the system to provide feedback on the synchronization of the micro-mirrors. The system then adjusts the operating frequency of the micro-mirrors accordingly to bring their movement into synchronization. Depending on the MEMS micro-mirror array's optical scanning angle and the size of the imaging sensor used, the imaging is timed according to the sensor's position to capture the beam pattern, since the scanning beam will not necessarily be on the sensor at all times.

Thermoelectric Cooler (TEC)

Figure 6:
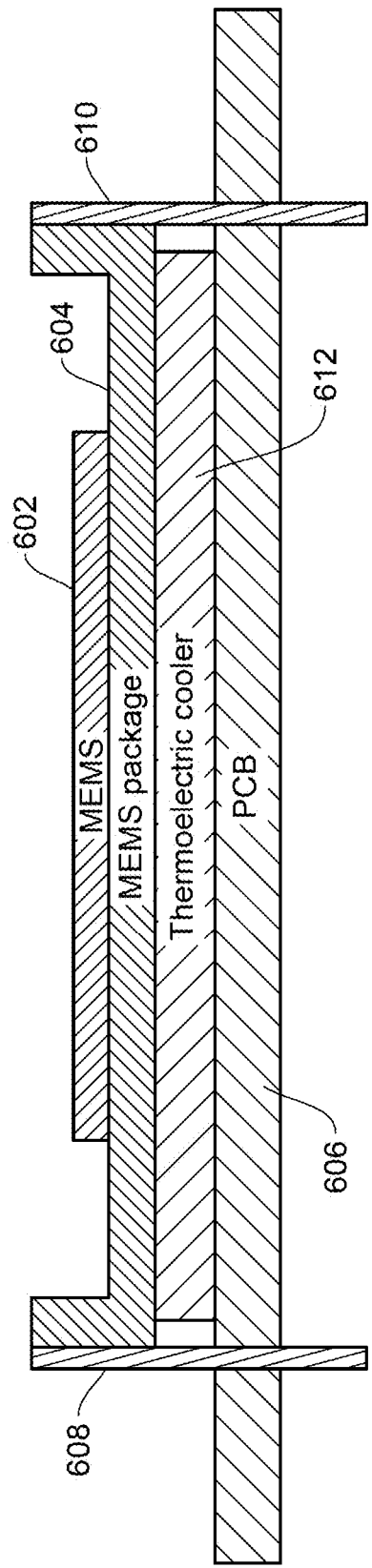
FIG. 6 illustrates a thermoelectric cooler (TEC) assembled on or integrated with a chip package according to certain embodiments.

FIG. 6 illustrates an embodiment with a thermoelectric cooler (TEC) assembled on or integrated with the package to control the temperature of the package based on environmental temperature to match the expansion of the MEMS die for the given temperature. A MEMS die 602 is mounted to a package 604. Package 604 is connected to a PCB 606 with pins 608 and 610. A thermoelectric cooler (TEC) 612 is mounted between PCB 608 and package 604.

Figures 7, 8:
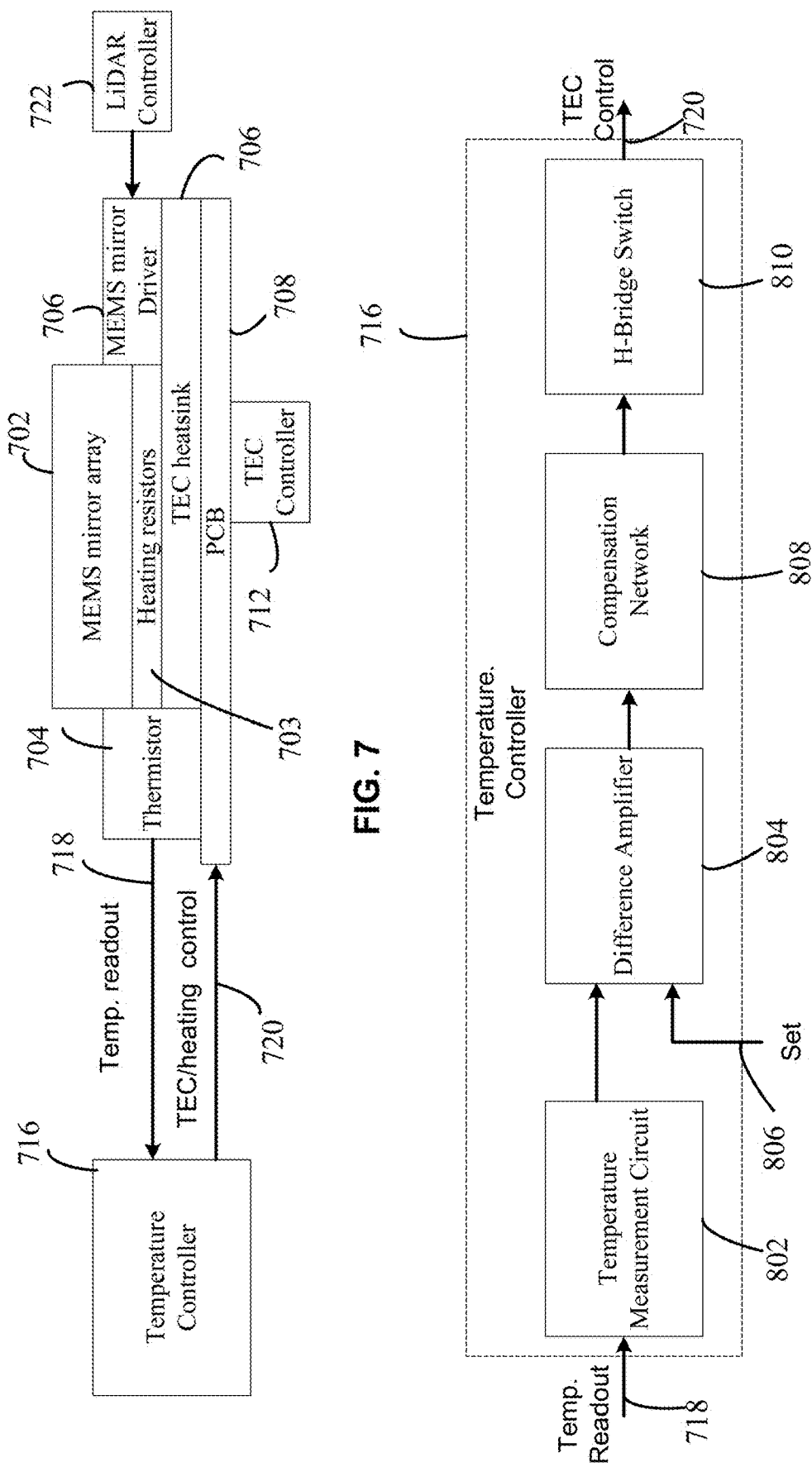
FIG. 7 shows an active temperature control system for a MEMS mirror array according to certain embodiments.
FIG. 8 is a diagram of the temperature controller of FIG. 7 according to an embodiment.

FIG. 7 shows an embodiment of an active temperature control system for a MEMS mirror array. A MEMS mirror array 702, with optional heating resistors 703, and a thermistor 704 are mounted on a printed circuit board (PCB) 708. A MEMS mirror driver 706 (which may be integrated with the MEMS mirror array 702) controls the angle and frequency of the MEMS mirror array, under control of a LiDAR controller 722. A thermoelectric cooler (TEC) consists of a TEC heatsink 706 and a TEC controller 712. The TEC heatsink 706 can optionally be mounted either inside or outside of the MEMS mirror array 702 module package. The thermistor 704 is placed close to the MEMS mirror array 702 to sense the MEMS mirror array temperature. The temperature information will be read out from the thermistor and sent to a temperature controller 716 on a temperature readout line 718. The temperature controller can be a dedicated microcontroller or can share the same central processing unit with the overall LiDAR module, or any other controller in the system. A target temperature may be defined by a narrow range between a minimum target temperature and a maximum target temperature. The temperature controller 716 compares the sensed temperature and a temperature set point (e.g., the minimum target temperature), and then generates the appropriate TEC control output on output line 720 to control the TEC controller 712. Output line 720 can also provide controls for driving current through heating resistors 703 (described in more detail below). If the temperature of the thermistor goes above the target temperature range, the controller can change the target temperature from the minimum target temperature to the maximum target temperature, to cause cooling to initiate. This negative feedback control loop will stabilize the MEMS mirror array temperature under a wide ambient temperature range. As shown, TEC controller 712 is mounted on the underside of PCB 708. Alternately, the TEC controller could be mounted on the top of PCB 708, adjacent MEMS mirror array 702.

FIG. 8 is a diagram of the temperature controller 716 of FIG. 7 according to an embodiment. Temperature readout line 718 from FIG. 7 is provided to the input of a temperature measurement circuit 802. An output of temperature measurement circuit 802 is provided to a first input of a difference amplifier 804. A second input to the difference amplifier is a set temperature 806, which corresponds to the target minimum temperature or the target maximum temperature. Difference amplifier 804 is then coupled to a compensation network 808, which in turn provides an output to an H-bridge switch 810. The output of the H-bridge switch is TEC control line 720.

Figure 9:
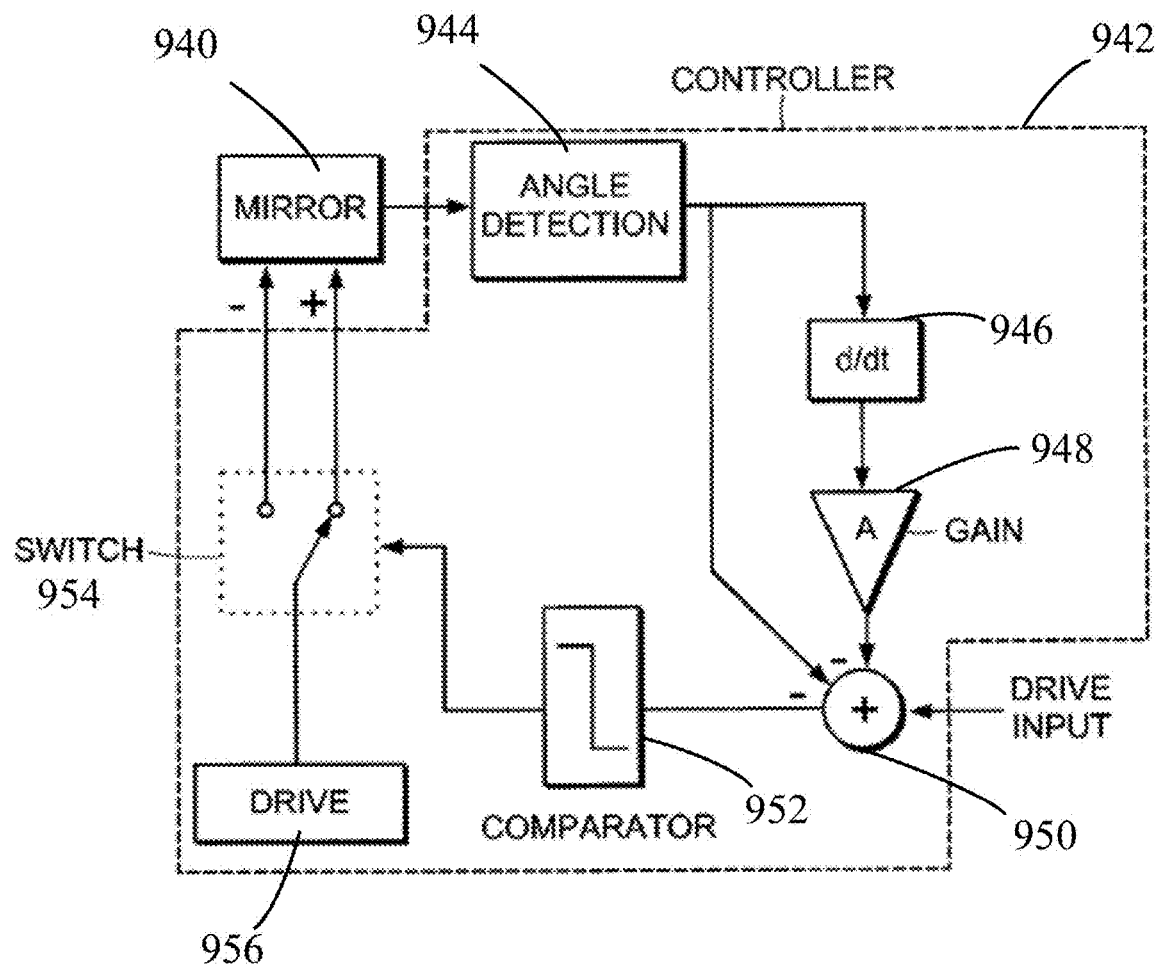
FIG. 9 is a block diagram of a reflective MEMS mirror angle and frequency control circuit, according to embodiments.

FIG. 9 is a block diagram of a reflective MEMS mirror angle and frequency control circuit, according to embodiments. This could be part of LiDAR controller 722 of FIG. 7, or a separate controller. The angle of a mirror 940 (which can be linked to the whole mirror array) is detected by an angle detector 944, such as by detecting a change in capacitance as the mirror rotates in a manner known by those of skill in the art. Angle detector 944 is part of a controller 942 which also includes a differentiator circuit 946 and amplifier 948, the output of which is provided to a summing circuit 950. Summing circuit 950 receives a drive input and provides it to a comparator 952 which compares the desired angle to the measured angle and provides an appropriate input to a switch 954. The switch connects a drive current 956 between different positions to drive the angle of mirror 940 to either a more positive or more negative angle. As understood by those skilled in the art, multiple loops using the same scheme can be used to control multiple axes of rotation with the same mirror or a separate mirror, such as shown in FIG. 3C.

In one embodiment, TEC 612 is controlled by monitoring the temperature with thermistor 704 to maintain MEMS mirror array 602 within a temperature range where it can maintain a predetermined resonant frequency. Alternately, the resonant frequency change can be determined by the arrangement of FIG. 5, and the TEC can adjust the temperature until the resonant frequency pattern of FIG. 4A is detected. When the ideal resonant pattern is detected, the temperature is noted, and the device is controlled to maintain that temperature.

In another embodiment, the TEC is only used to control within a certain range, and the resonant frequency is fine-tuned within that range using a look-up table of temperatures and corresponding resonant frequencies determined during a test phase. The resonant frequency could also be measured from the angle of the individual mirrors and the timing of arriving at the target angle. However the divergence from the resonant frequency is measured, a feedback loop can be used to determine the appropriate temperature for the resonant frequency.

Heating Resistors

FIGS. 10A-10B are diagrams of an array of heating resistors according to an embodiment. The heating resistors are used to control the temperature of the MEMS mirror array and maintain the desired resonant frequency. MEMS heating resistor(s) are integrated into the MEMS micro mirror(s) at strategic locations to provide a primary or secondary control to fine-tune thermal expansion of the die.

A MEMS mirror array 1001 has a number of individual mirrors, such as mirrors 1002, 1004, 1006 and 1008. Throughout the array are a plurality of heating resistors, such as resistors 1010, 1012, 1014, 1016, 1018 and 1020. These resistors can be connected in series, with a column of resistors controlled together. Although not shown, additional resistors could be provided along some or all of the rows of the array, perpendicular to the resistors in the columns. The amount of heat generated can be varied by varying the resistance at each position or by varying the size of the resistors. The resistors can be connected in series with conductors, or can be one long resistor line, with portions that are more resistive than others. Also, although a series of single resistors are shown, multiple resistors in parallel and/or series could be provided at each position, with the number of resistors varying according to the desired heating at that position. Rows of resistors can be provided, or both rows and columns, with two axis temperature control. There could be no heating resistors at some locations, skipping some mirrors or portions of mirrors. In general, the spring tension of the torsion bars supporting the mirrors is smaller at the edges, by as much as a half, resulting in a smaller resonant frequency. This can be partially compensated for in some embodiments by having torsion bars with different widths in different positions. A wider torsion beam will resonate at a higher frequency, and thus the torsion bars near the edges can be made wider.

FIG. 10B is a cross-sectional view of the MEMS mirror array of FIG. 10A at heating resistor 1020. Heating resistor 1020 is over a buried oxide layer 1024 in a handle layer 1026 at the bottom of a cavity 1028 in which mirror 1008 rotates on a torsion beam 1022. Although heating resistor 1020 is shown extending all the way across cavity 1028, under the entire length of mirror 1008, it could only be at a middle portion, or could be wider or otherwise more resistive in the middle or at the edges, or any other configuration.

The heating resistors could also be controlled independently to also compensate for stress differences that could happen among individual micro mirrors in a micro mirror array depending on the location of the individual mirror. For instance, the spring constant of hinges of micro mirrors around the edge of the array could be lower, resulting in a smaller resonant frequency for mirrors at the edge than mirrors in the middle. Compensation at the edges requires heating the center to equalize the resonant frequencies.

In one embodiment, the TEC described above is used to control the temperature of the whole array, and the heating resistors are used to fine-tune the heating at different portions of the array. For example, it may be desirable to heat the edges more than the middle of the array, or vice-versa. In another embodiment, heating resistors could be used without a TEC. Since a configuration with only heating resistors could not control the resonant frequency if the temperature goes above the target temperature for the desired resonant frequency, another method of control can be added. That method can be to change the resonant frequency according to a table of resonant frequencies versus temperature. Alternately, a trial and error adjustment can be done until an image sensor detects a resonant frequency pattern at such a higher temperature. Alternately, a resonant frequency for a very high target temperature can be used, such that it would be unlikely to be reached by environmental temperatures alone.

In an embodiment using only heating resistors, and not a TEC, the controller of FIG. 8 can be simplified. The temperature adjacent to the laser die is sensed with the temperature controller 716. If the temperature goes below the desired temperature range, a current driver is activated to pump current into the heating resistors. The temperature is constantly monitored and fed back to the temperature controller 716. The temperature controller 716 will decide how much current needs to be pumped into the resistor in real-time to maintain the target temperature, using compensation network 808. The compensation network 808 can be either hardware or software or a combination. The software can include compensation algorithms such as a PD (Proportional-Derivative) or PID (Proportional-Integral-Derivative) controller. H-Bridge Switch 810 can be eliminated from temperature controller 716 in this embodiment. Also, the TEC controller 712 and TEC heatsink 706 would be eliminated in this heating resistor only embodiment. This embodiment can only heat, and not cool, to achieve the desired temperature range. Thus, the temperature range in one embodiment is chosen at the high end of the operating temperature range with a desirable resonant frequency, so that cooling is not needed. In one embodiment, the target or designated temperature range corresponds to an ambient temperature range of +65/70-85 degrees Celsius.

Additional Pins to Distribute Stress

Another way of minimizing the effect of CTE mismatch between the package and the PCB is using additional pins all around the perimeter and/or in the center of the package that would be soldered onto the PCB, to distribute the stress evenly irrespective to the shape of the package (i.e. rectangular, square, etc.).

FIG. 11A is a cross-sectional view of a MEMS mirror array mounted in a MEMS package on a PCB in one embodiment. MEMS mirror array chip 1102 is mounted in MEMS package 1104, which in turn is mounted on PCB 1106. Pins 1108 are provided at the sides. With variation in temperature, the CTE mismatch will cause bowing and gaps as illustrated in FIG. 11B. A gap 1109 forms between MEMS mirror array chip 1102 and MEMS package 1104, and another gap 1110 forms between MEMS package 1104 and PCB 1106. The resulting stresses on the structures of MEMS chip 1102 cause changes in the resonant frequency.

FIG. 11C illustrates a structure with additional pins according to an embodiment. Additional pins 1112 are added along the length (in addition to the width) of the MEMS package 1104. Packages with pins assigned along the length have been determined to have a more stable divergence of the micro mirror array compared to packages with pins assigned only along the width. As the pins are soldered on to the PCB, it reduces the bending of the package along the pins. The same concept can be applied in the other axis of the package to reduce the bending in the other direction. The additional pins can be simply for providing extra stability, without being connected to anything. In one embodiment, some or all of the additional pins are connected to ground. Alternately, some of the pins can provide additional supply voltage connections, such as a substrate voltage for a Si layer below a buried oxide (BOX) layer, or another electrical pad.

In one embodiment, the additional support pins are thicker than the pins used for circuit connections. Additionally, the package itself can be made thicker to minimize bowing. In one embodiment, the package thickness is between 0.5 and 2 millimeters, and the pin thickness of the support pins is between 0.1 and 1 millimeters, and the pins are spaced between 1 and 5 millimeters apart from each other. Both a thicker package and thicker pins result in a package that won't bend as easily.

Figure 12A:
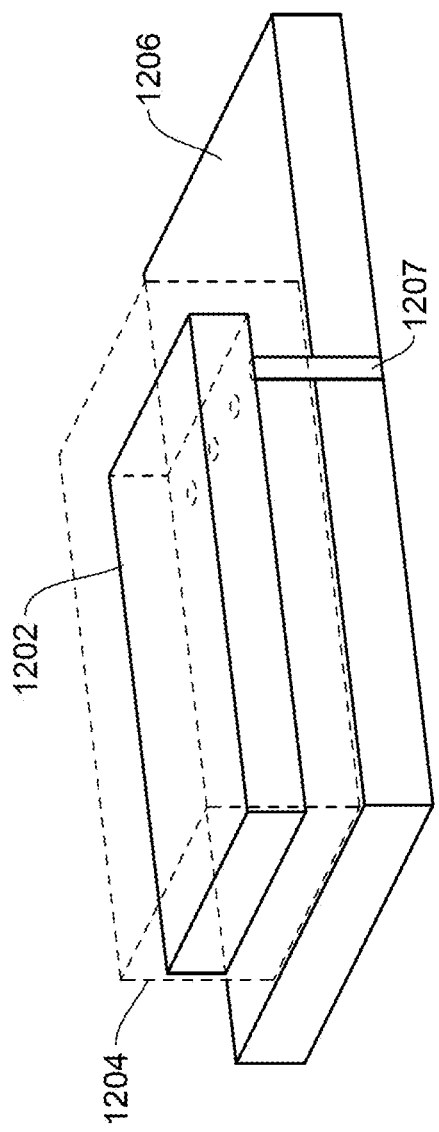
FIGS. 12A-B are cut-away views of a simplified simulation model of a pin package with pins along the short side according to an embodiment.
Figure 12B:
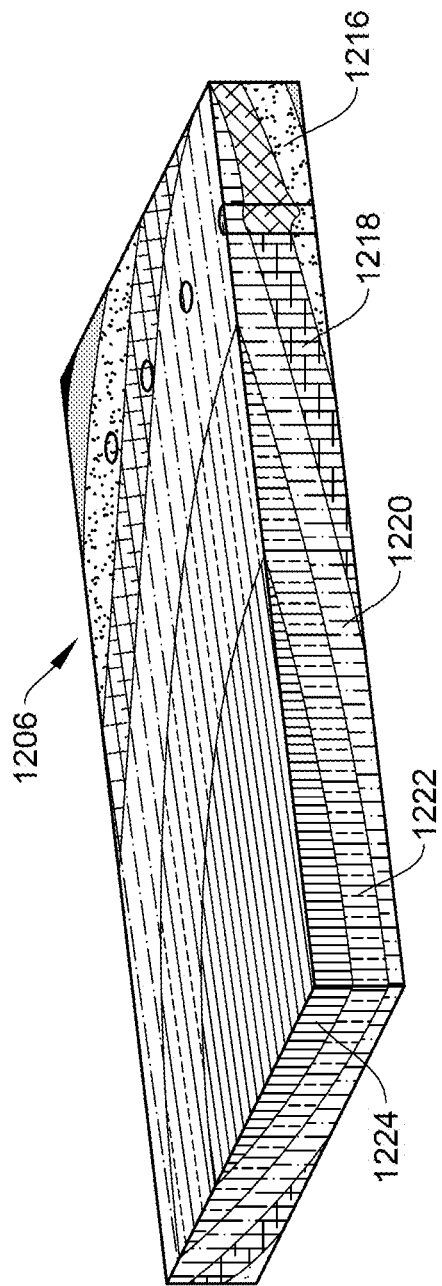

FIGS. 12A-B are cut-away views of a simplified simulation model of a pin package with pins along the short side according to an embodiment, showing the stress/bend profile. FIG. 12A shows a MEMS mirror array chip 1202 mounted in a package 1204 which is mounted on a PCB 1206. Pins 1207 are on a short side of package 1204. FIG. 12B shows the resulting stress or bend profile due to CTE mismatch when the temperature is increased by 60° C. Area 1224 has the least amount of bend, with a bend ranging from 0 to 0.240 µm. From there, the amount of bend increases to 0.240-0.456 µm in area 1222, 0.456-0.744 µm in area 1220, 0.744-0.992 µm in area 1218, and 0.992-1.240 µm at area 1216.

Figure 13A:
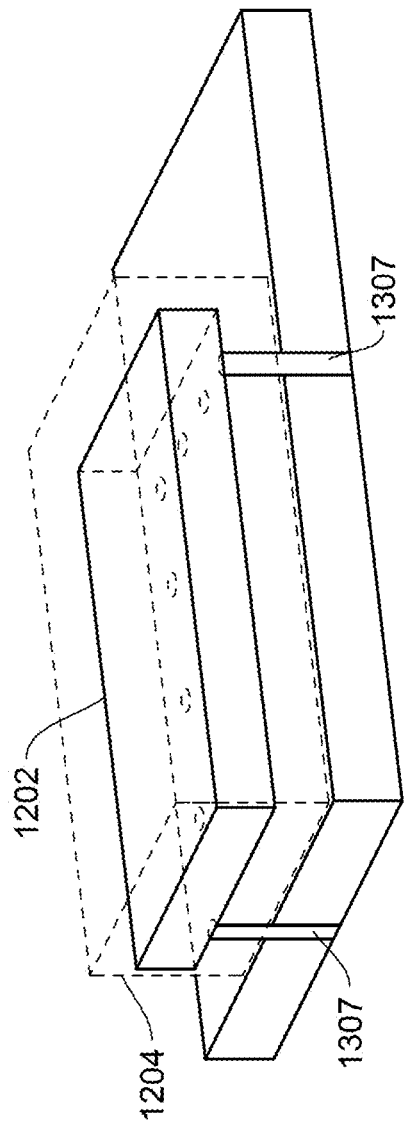
FIGS. 13A-B are cut-away views of a simplified simulation model of a pin package with pins on both short and long sides according to an embodiment.
Figure 13B:
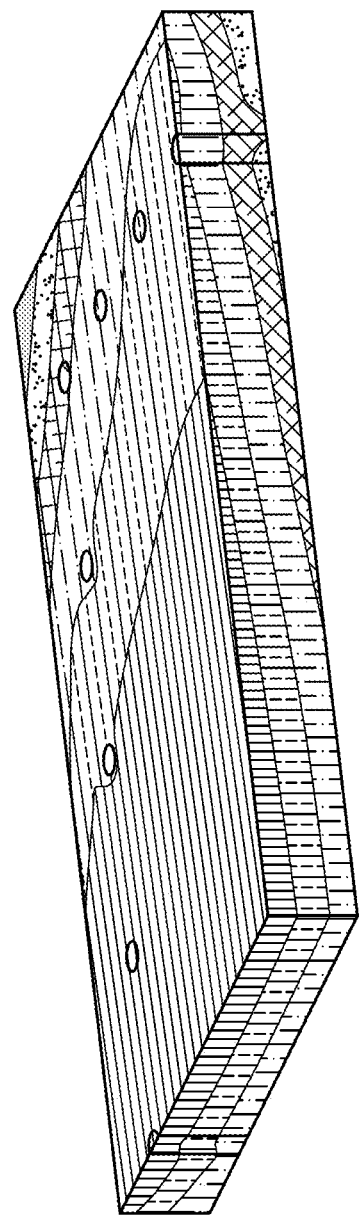

FIGS. 13A-B are cut-away views of a simplified simulation model of a pin package with pins with pins on both short and long sides according to an embodiment, showing the stress/bend profile. FIG. 13A shows a MEMS mirror array chip 1202 mounted in a package 1204 which is mounted on a PCB 1206. Pins 1307 are on both short and long sides of package 1204. FIG. 13B shows the resulting stress or bend profile due to CTE mismatch when the temperature is increased by 60° C. As can be seen, the variation in the amount of stress and bend is less than in FIG. 12B, with a smaller maximum bend. Compared to packages with pins arranged only along two sides, packages with pins place around all sides show smaller bend profiles when soldered and heated together with a PCB.

Figure 14A:
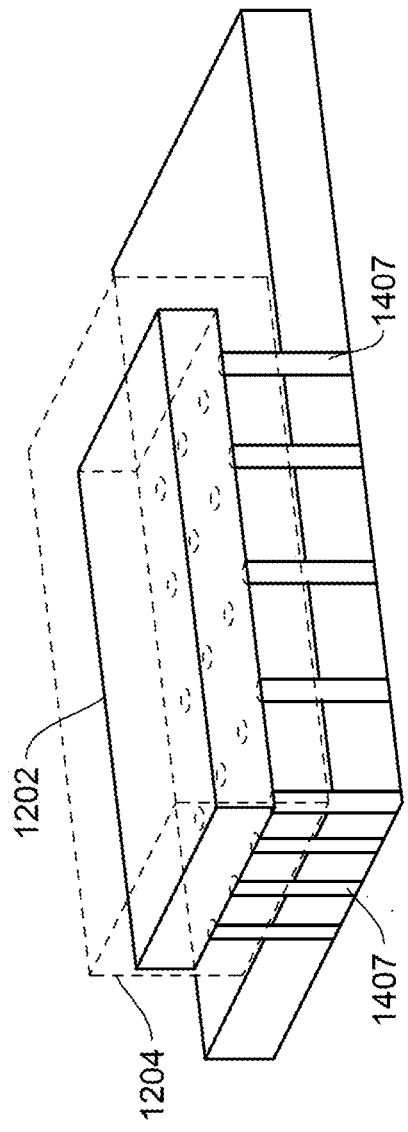
FIGS. 14A-B are cut-away views of a simplified simulation model of a pin package with pins arranged in an array according to an embodiment.
Figure 14B:
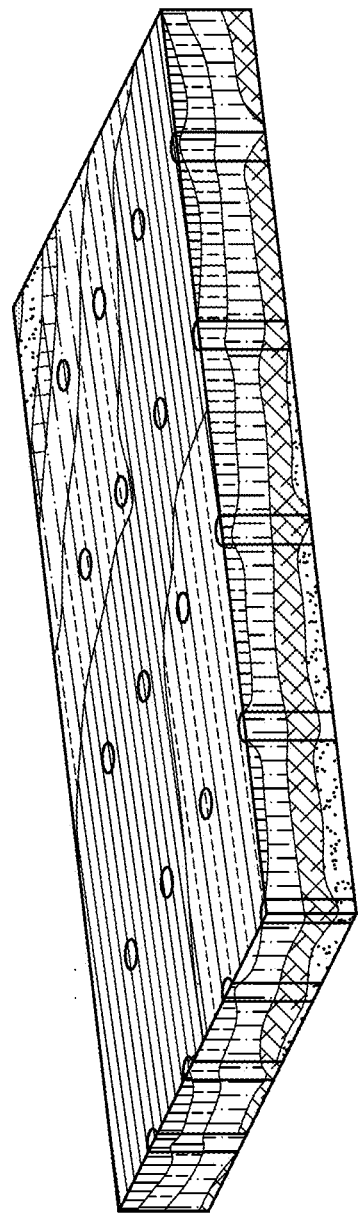

FIGS. 14A-B are cut-away views of a simplified simulation model of a pin package with pins arranged in a 7×9 array (with only a portion of the array shown) according to an embodiment, showing the stress/bend profile. FIG. 14A shows a MEMS mirror array chip 1202 mounted in a package 1204 which is mounted on a PCB 1206. Pins 1407 are attached to package 1204. FIG. 14B shows the resulting stress or bend profile due to CTE mismatch when the temperature is increased by 60° C. As can be seen, the variation in the amount of stress and bend is less than in both FIG. 12B and FIG. 13B.

Pin Vias to Allow Expansion

Figure 15A:
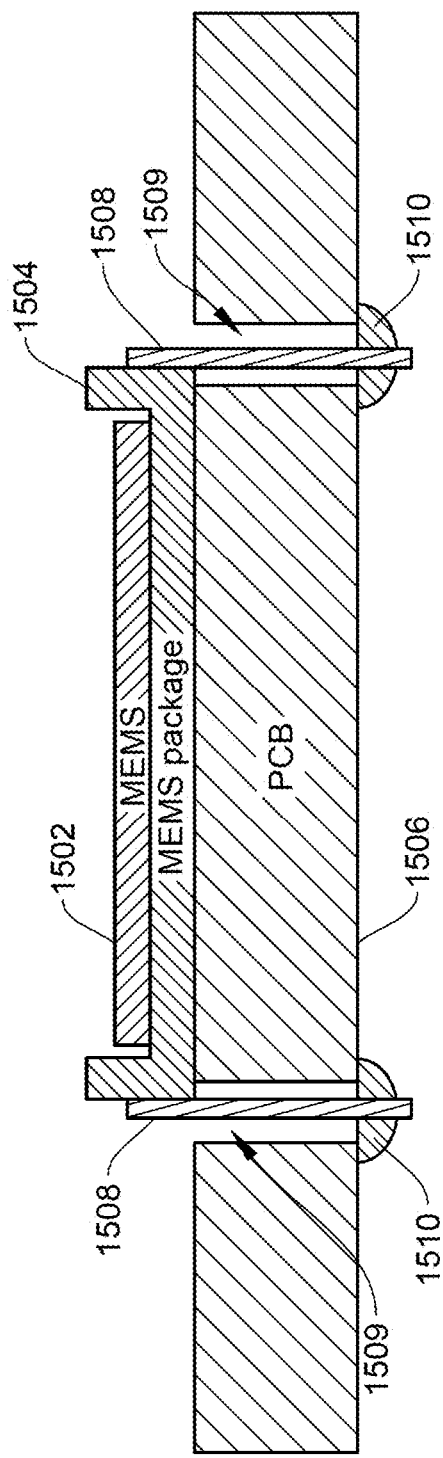
FIGS. 15A-B are cross-sectional views of flexible pins and via holes with expansion space according to embodiments.
Figure 15B:
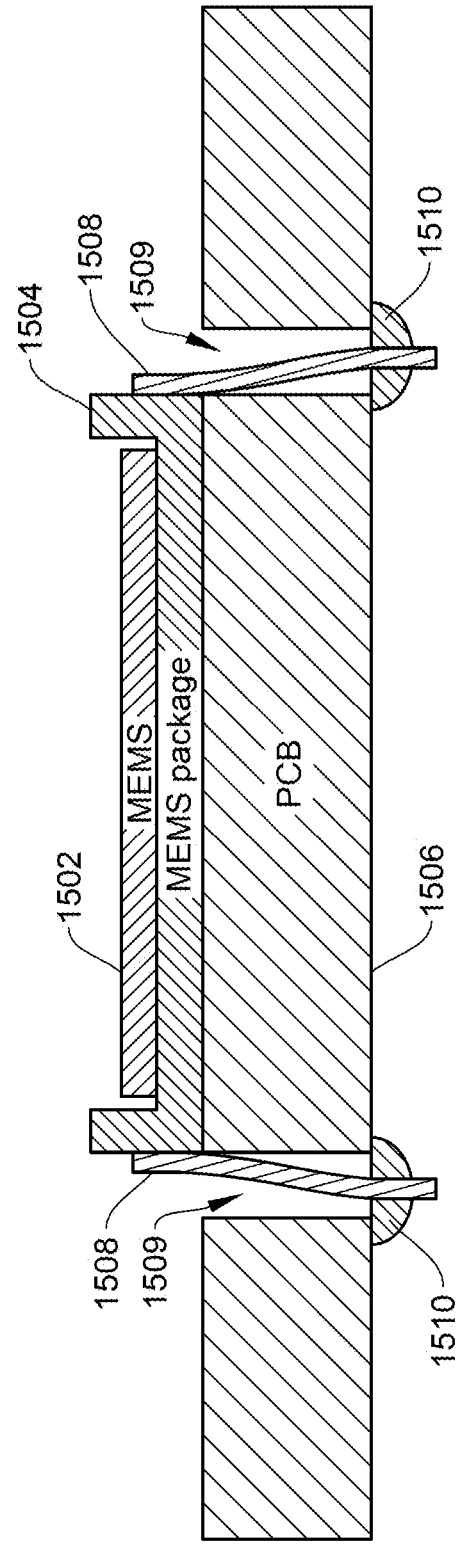

FIGS. 15A-B are cross-sectional views of flexible pins with via holes with expansion space according to embodiments. The pins are made in a shape and material that can bend easily to relieve the stress between the package and the PCB. For example, they can be thinner in one or both directions. The pins are the main mechanical link between the MEMS package and the PCB. The expansion mismatch due to difference in CTE between the MEMS package and the PCB can be at least partially compensated for by the deformation of the pins. The via holes for the MEMS package pins have extra spacing for the pins to bend without being restricted by the PCB. The vias are wider than the pins toward/away from package, and only minimally side to side to allow movement toward/away from the package.

FIG. 15A shows a MEMS mirror array chip 1502 mounted in a package 1504 on a PCB 1506. Pins 1508 are attached to package 1504. Vias 1509 provide space for pins 1508 to bend toward and away from the package 1508. Pins 1508 are bonded to the bottom of PCB 1506 at the bottom of vias 1509 with solder 1510.

FIG. 15B shows MEMS mirror array chip 1502 mounted in a package 1504 on a PCB 1506 when there has been a temperature change. Due to CTE mismatch, PCB 1506 has expanded in size. Instead of causing stress due to the resistance from pins 1508, pins 1508 bend outward, relieving the stress. To assemble this structure with pins in the middle of open vias, the pins are attached to MEMS package 1504. A jig is then used to hold MEMS package 1504 so that pins 1508 are in center of via holes 1509. Solder 1510 is then applied to the bottom of the pins 1508 to hold them to PCB 1506.

By using a combination of these compensation mechanisms, the resonant frequency and die curvature can be maintained for a wide range of temperatures and also can be fine-tuned such that resonant frequency and divergence of multiple micro mirror dice could be matched closely.

Figure 16:
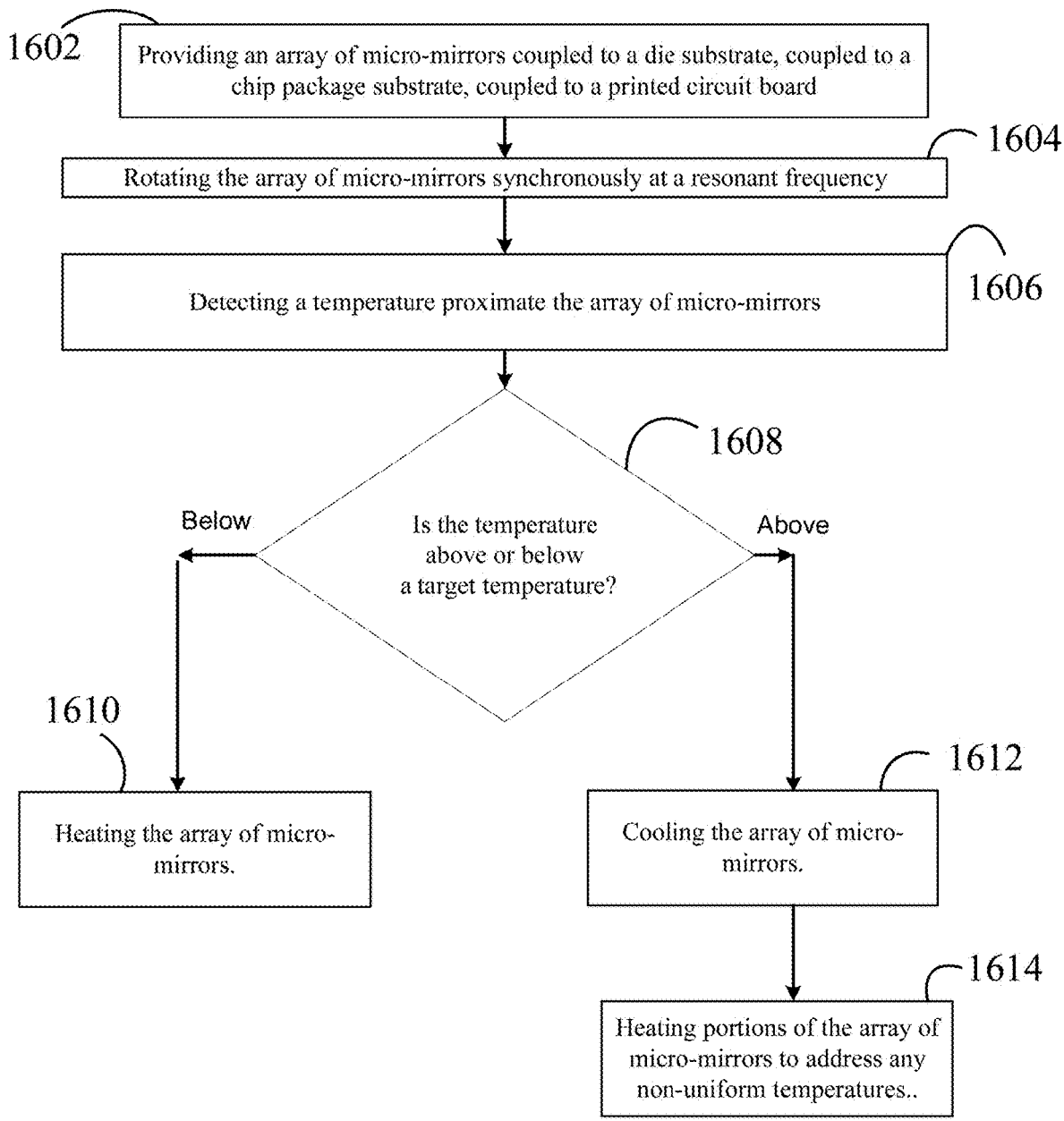
FIG. 16 is a flow chart illustrating a method for controlling the resonant frequency of an array of micro-mirrors according to certain embodiments.

FIG. 16 is a flow chart illustrating a method for controlling the resonant frequency of an array of micro-mirrors in a micro-electromechanical system (MEMS) mirror chip according to an embodiment. The method includes providing an array of micro-mirrors coupled to a die substrate, coupled to a chip package substrate, coupled to a printed circuit board, all having different CTEs (step 1602). In operation, the steps include rotating the array of micro-mirrors synchronously at a resonant frequency (step 1604) and detecting a temperature proximate the array of micro-mirrors (step 1606). It is determined if the temperature is above or below a target temperature (step 1608) that will change the resonant frequency (due to changes in temperature causing stresses due to a mismatch between the CTEs). If the temperature is too low, the array of micro-mirrors is heated (step 1610). If the temperature is too high, the array of micro-mirrors is cooled (step 1612). In one embodiment, the temperature control is then fine-tuned for different portions of the array of micro-mirrors by heating portions of the array (step 1614).

In sum, embodiments of the present invention provide a micro-electromechanical system (MEMS) apparatus for beam steering in a Light Detection and Ranging (LiDAR) system 102 of an autonomous vehicle 100. A mirror 304 has a reflective surface and at least first and second respective sides. First and second supporting torsion springs 302 are connected to the first and second respective sides of the mirror 304, on opposite sides, to support the mirror. First and second common terminals 310 are connected to the first and second supporting torsion springs. A plurality of first fingers 306 extend from the mirror 304 on first and second sides orthogonal to the first and second supporting torsion springs 302. First and second bias terminals 314 are opposite the first and second sides of the mirror 304. A plurality of second fingers 312 extend from the first and second bias terminals, the plurality of second fingers being interleaved with the plurality of first fingers and partially overlapping the plurality of first fingers. A control circuit 722 controls rotating the mirror around an axis of the first and second supporting torsion springs at a resonant frequency. An oxide layer 320 is below the first and second common terminals and the first and second bias terminals. A die substrate 322 below the oxide layer has a first Coefficient of Thermal Expansion (CTE). A die attach material used to adhere MEMS 602 to a chip package 604 has a second CTE. A chip package 604 is coupled to the die substrate and has a chip package substrate with a third CTE. A printed circuit board 606 is coupled to the chip package, the printed circuit board having a fourth CTE. Also provided is a means (612, 703, 1112, 1509) for reducing changes in the resonant frequency due to changes in temperature causing stresses due to a mismatch between the first, second, third and fourth CTE.

Example LiDAR System Implementing Aspects of Embodiments Herein

Figure 17:
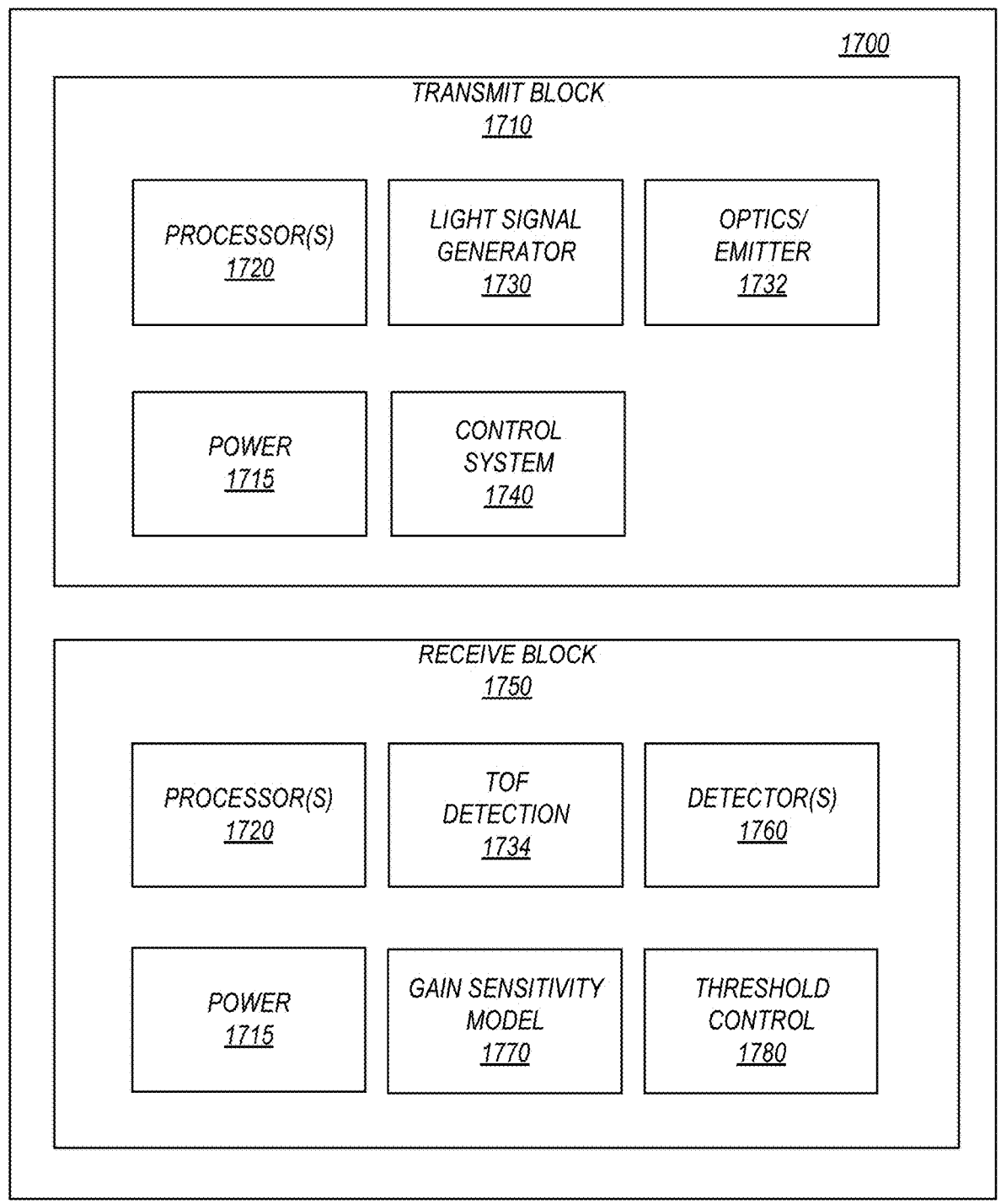
FIG. 17 illustrates a simplified block diagram showing aspects of a LiDAR-based detection system, according to certain embodiments of the invention.

The system and method described herein limits changes in resonant frequency with temperature, which allows systems with a narrow range of control to be used. Those control systems, into which the present invention is integrated, will now be described. FIG. 17 illustrates a simplified block diagram showing aspects of a LiDAR-based detection system 1700, according to certain embodiments. System 1700 may be configured to transmit, detect, and process LiDAR signals to perform object detection as described above with regard to LiDAR system 100 described in FIG. 1. In general, a LiDAR system 1700 includes one or more transmitters (e.g., transmit block 1710) and one or more receivers (e.g., receive block 1750). LiDAR system 1700 may further include additional systems that are not shown or described to prevent obfuscation of the novel features described herein.

Transmit block 1710, as described above, can incorporate a number of systems that facilitate that generation and emission of a light signal, including dispersion patterns (e.g., 360 degree planar detection), pulse shaping and frequency control, Time-Of-Flight (TOF) measurements, and any other control systems to enable the LiDAR system to emit pulses in the manner described above. In the simplified representation of FIG. 10, transmit block 1010 can include processor(s) 1720, light signal generator 1730, optics/emitter module 1732, power block 1715 and control system 1740. Some of all of system blocks 1720-1740 can be in electrical communication with processor(s) 1720.

In certain embodiments, processor(s) 1720 may include one or more microprocessors (μCs) and can be configured to control the operation of system 1700. Alternatively or additionally, processor 1020 may include one or more microcontrollers (MCUs), digital signal processors (DSPs), or the like, with supporting hardware, firmware (e.g., memory, programmable I/Os, etc.), and/or software, as would be appreciated by one of ordinary skill in the art. Alternatively, MCUs, μCs, DSPs, ASIC, programmable logic device, and the like, may be configured in other system blocks of system 1700. For example, control system block 1740 may include a local processor to certain control parameters (e.g., operation of the emitter). Processor(s) 1720 may control some or all aspects of transmit block 1710 (e.g., optics/emitter 1732, control system 1740, dual sided mirror 220 position as shown in FIG. 1, position sensitive device 250, etc.), receive block 1750 (e.g., processor(s) 1720) or any aspects of LiDAR system 1700. In some embodiments, multiple processors may enable increased performance characteristics in system 1700 (e.g., speed and bandwidth), however multiple processors are not required, nor necessarily germane to the novelty of the embodiments described herein. The processors also control the resonant frequency of the MEMS mirror array, and in embodiments may vary the resonant frequency with temperature as an additional method of compensating for temperature changes. Alternatively or additionally, certain aspects of processing can be performed by analog electronic design, as would be understood by one of ordinary skill in the art.

Light signal generator 1730 may include circuitry (e.g., a laser diode) configured to generate a light signal, which can be used as the LiDAR send signal, according to certain embodiments. In some cases, light signal generator 1730 may generate a laser that is used to generate a continuous or pulsed laser beam at any suitable electromagnetic wavelengths spanning the visible light spectrum and non-visible light spectrum (e.g., ultraviolet and infra-red). In some embodiments, lasers are commonly in the range of 600-1200 nm, although other wavelengths are possible, as would be appreciated by one of ordinary skill in the art.

Optics/Emitter block 1732 (also referred to as transmitter 1732) may include one or more arrays of mirrors (including but not limited to the mirror array as described above in FIGS. 1-3, 7 and 10) for redirecting and/or aiming the emitted laser pulse, mechanical structures to control spinning and/or moving of the emitter system, or other system to affect the system field-of-view, as would be appreciated by one of ordinary skill in the art with the benefit of this disclosure. For instance, some systems may incorporate a beam expander (e.g., convex lens system) in the emitter block that can help reduce beam divergence and increase the beam diameter. These improved performance characteristics may mitigate background return scatter that may add noise to the return signal. In some cases, optics/emitter block 1732 may include a beam splitter to divert and sample a portion of the pulsed signal. For instance, the sampled signal may be used to initiate the TOF clock. In some cases, the sample can be used as a reference to compare with backscatter signals. Some embodiments may employ micro-electro-mechanical systems (MEMS) mirrors that can reorient light to a target field. Alternatively or additionally, multi-phased arrays of lasers may be used. Any suitable system may be used to emit the LiDAR send pulses, as would be appreciated by one of ordinary skill in the art.

Power block 1715 can be configured to generate power for transmit block 1710, receive block 1750, as well as manage power distribution, charging, power efficiency, and the like. In some embodiments, power management block 1715 can include a battery (not shown), and a power grid within system 1700 to provide power to each subsystem (e.g., control system 1740, etc.). The functions provided by power management block 1715 may be subsumed by other elements within transmit block 1710, or may provide power to any system in LiDAR system 1700. Alternatively, some embodiments may not include a dedicated power block and power may be supplied by a number of individual sources that may be independent of one another.

Control system 1740 may control aspects of light signal generation (e.g., pulse shaping), optics/emitter control, TOF timing, or any other function described herein. In some cases, aspects of control system 1740 may be subsumed by processor(s) 1720, light signal generator 1730, or any block within transmit block 1710, or LiDAR system 1700 in general.

Receive block 1750 may include circuitry configured to detect a process a return light pulse to determine a distance of an object, and in some cases determine the dimensions of the object, the velocity and/or acceleration of the object, and the like. Processor(s) 1765 may be configured to perform operations such as processing received return pulses from detectors(s) 1760, controlling the operation of TOF module 1734, controlling threshold control module 1780, or any other aspect of the functions of receive block 1750 or LiDAR system 1700 in general.

TOF module 1734 may include a counter for measuring the time-of-flight of a round trip for a send and return signal. In some cases, TOF module 1734 may be subsumed by other modules in LiDAR system 1700, such as control system 1740, optics/emitter 1732, or other entity. TOF modules 1734 may implement return "windows" that limit a time that LiDAR system 1700 looks for a particular pulse to be returned. For example, a return window may be limited to a maximum amount of time it would take a pulse to return from a maximum range location (e.g., 250 m). Some embodiments may incorporate a buffer time (e.g., maximum time plus 10%). TOF module 1734 may operate independently or may be controlled by other system block, such as processor(s) 1720, as described above. In some embodiments, transmit block may also include a TOF detection module. One of ordinary skill in the art with the benefit of this disclosure would appreciate the many modification, variations, and alternative ways of implementing the TOF detection block in system 1700.

Detector(s) 1760 may detect incoming return signals that have reflected off of one or more objects. In some cases, LiDAR system 1700 may employ spectral filtering based on wavelength, polarization, and/or range to help reduce interference, filter unwanted frequencies, or other deleterious signals that may be detected. Typically, detector(s) 1760 can detect an intensity of light and records data about the return signal (e.g., via coherent detection, photon counting, analog signal detection, or the like). Detector (s) 1760 can use any suitable photodetector technology including solid state photodetectors (e.g., silicon avalanche photodiodes, complimentary metal-oxide semiconductors (CMOS), charge-coupled devices (CCD), hybrid CMOS/CCD devices) or photomultipliers. In some cases, a single receiver may be used or multiple receivers may be configured to operate in parallel.

Gain sensitivity model 1770 may include systems and/or algorithms for determining a gain sensitivity profile that can be adapted to a particular object detection threshold. The gain sensitivity profile can be modified based on a distance (range value) of a detected object (e.g., based on TOF measurements). In some cases, the gain profile may cause an object detection threshold to change at a rate that is inversely proportional with respect to a magnitude of the object range value. A gain sensitivity profile may be generated by hardware/software/firmware, or gain sensor model 1770 may employ one or more look up tables (e.g., stored in a local or remote database) that can associate a gain value with a particular detected distance or associate an appropriate mathematical relationship there between (e.g., apply a particular gain at a detected object distance that is 10% of a maximum range of the LiDAR system, apply a different gain at 15% of the maximum range, etc.). In some cases, a Lambertian model may be used to apply a gain sensitivity profile to an object detection threshold. The Lambertian model typically represents perfectly diffuse (matte) surfaces by a constant bidirectional reflectance distribution function (BRDF), which provides reliable results in LiDAR system as described herein. However, any suitable gain sensitivity profile can be used including, but not limited to, Oren-Nayar model, Nanrahan-Krueger, Cook-Torrence, Diffuse BRDF, Limmel-Seeliger, Blinn-Phong, Ward model, HTSG model, Fitted Lafortune Model, or the like. One of ordinary skill in the art with the benefit of this disclosure would understand the many alternatives, modifications, and applications thereof.

Threshold control block 1780 may set an object detection threshold for LiDAR system 1700. For example, threshold control block 1780 may set an object detection threshold over a certain a full range of detection for LiDAR system 1700. The object detection threshold may be determined based on a number of factors including, but not limited to, noise data (e.g., detected by one or more microphones) corresponding to an ambient noise level, and false positive data (typically a constant value) corresponding to a rate of false positive object detection occurrences for the LiDAR system. In some embodiments, the object detection threshold may be applied to the maximum range (furthest detectable distance) with the object detection threshold for distances ranging from the minimum detection range up to the maximum range being modified by a gain sensitivity model (e.g., Lambertian model).

Although certain systems may not expressly discussed, they should be considered as part of system 1700, as would be understood by one of ordinary skill in the art. For example, system 1700 may include a bus system (e.g., CAMBUS) to transfer power and/or data to and from the different systems therein. In some embodiments, system 1700 may include a storage subsystem (not shown). A storage subsystem can store one or more software programs to be executed by processors (e.g., in processor(s) 1720). It should be understood that "software" can refer to sequences of instructions that, when executed by processing unit(s)

(e.g., processors, processing devices, etc.), cause system 1700 to perform certain operations of software programs. The instructions can be stored as firmware residing in read only memory (ROM) and/or applications stored in media storage that can be read into memory for processing by processing devices. Software can be implemented as a single program or a collection of separate programs and can be stored in non-volatile storage and copied in whole or in-part to volatile working memory during program execution. From a storage subsystem, processing devices can retrieve program instructions to execute in order to execute various operations (e.g., software-controlled spring auto-adjustment, etc.) as described herein. Some software controlled aspects of LiDAR system 1700 may include aspects of gain sensitivity model 1770, threshold control 1780, control system 1740, TOF module 1734, or any other aspect of LiDAR system 1700.

It should be appreciated that system 1700 is meant to be illustrative and that many variations and modifications are possible, as would be appreciated by one of ordinary skill in the art. System 1700 can include other functions or capabilities that are not specifically described here. For example, LiDAR system 1700 may include a communications block (not shown) configured to enable communication between LiDAR system 1700 and other systems of the vehicle or remote resource (e.g., remote servers), etc., according to certain embodiments. In such cases, the communications block can be configured to provide wireless connectivity in any suitable communication protocol (e.g., radio-frequency (RF), Bluetooth, BLE, infra-red (IR), ZigBee, Z-Wave, Wi-Fi, or a combination thereof).

While system 1700 is described with reference to particular blocks (e.g., threshold control block 1780), it is to be understood that these blocks are defined for understanding certain embodiments of the invention and is not intended to imply that embodiments are limited to a particular physical arrangement of component parts. The individual blocks need not correspond to physically distinct components. Blocks can be configured to perform various operations, e.g., by programming a processor or providing appropriate processes, and various blocks may or may not be reconfigurable depending on how the initial configuration is obtained. Certain embodiments can be realized in a variety of apparatuses including electronic devices implemented using any combination of circuitry and software. Furthermore, aspects and/or portions of system 1700 may be combined with or operated by other sub-systems as informed by design. For example, power management block 1715 and/or threshold control block 1780 may be integrated with processor(s) 1720 instead of functioning as separate entities.

Example Computer Systems Implementing Aspects of Embodiments Herein

Figure 18:
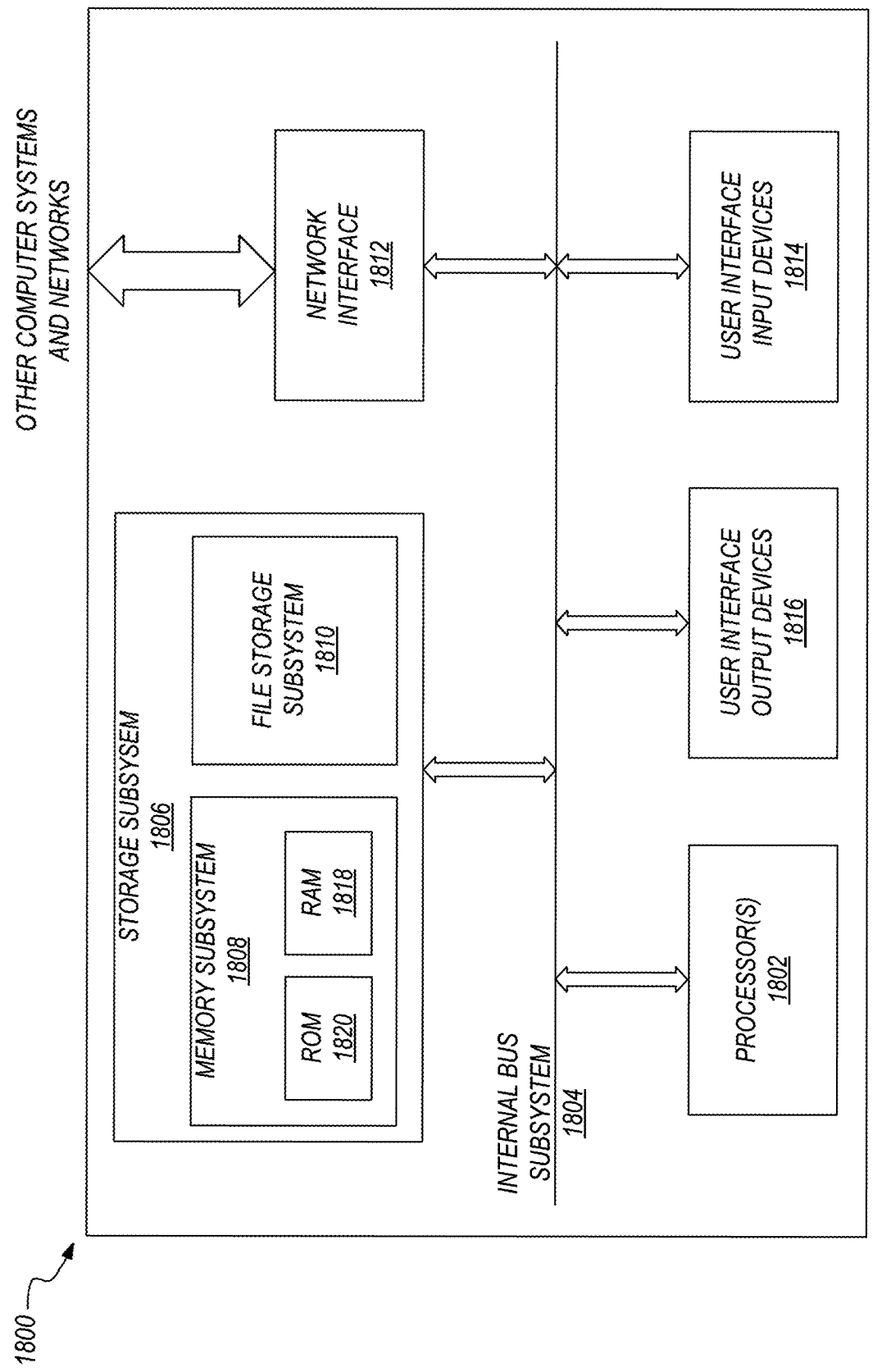
FIG. 18 illustrates an example computer system that may be utilized to implement techniques disclosed herein, according to certain embodiments of the invention.

FIG. 18 is a simplified block diagram of a computing system 1800 configured to operate aspects of a LiDAR-based detection system, according to certain embodiments. Computing system 1800 can be used to implement any of the systems and modules discussed above, including LiDAR controllers 206, 722 of FIGS. 2, 7. In addition, computing system 1800 may operate aspects of threshold control 1780, TOF module 1734, processor(s) 1720, control system 1740, or any other element of LiDAR system 1700 or other system described herein. Computing system 1800 can include, for example, a field programmable gate array (FPGA), an application specific integrated circuit (ASIC), and a general purpose central processing unit (CPU), to implement the disclosed techniques, including the techniques described above using controllers 206, 722 of FIGS. 2 and 7. In some examples, computing system 1800 can also one or more processors 1802 that can communicate with a number of peripheral devices (e.g., input devices) via a bus subsystem 1804. Processors 1802 can be an FPGA, an ASIC, a CPU, etc. These peripheral devices can include storage subsystem 1806 (comprising memory subsystem 1808 and file storage subsystem 1810), user interface input devices 1814, user interface output devices 1816, and a network interface subsystem 1812.

In some examples, internal bus subsystem 1804 (e.g., CAMBUS) can provide a mechanism for letting the various components and subsystems of computing system 1800 communicate with each other as intended. Although internal bus subsystem 1804 is shown schematically as a single bus, alternative embodiments of the bus subsystem can utilize multiple buses. Additionally, network interface subsystem 1812 can serve as an interface for communicating data between computing system 1800 and other computer systems or networks. Embodiments of network interface subsystem 1812 can include wired interfaces (e.g., Ethernet, CAN, RS232, RS485, etc.) or wireless interfaces (e.g., ZigBee, Wi-Fi, cellular, etc.).

In some cases, user interface input devices 1814 can include a keyboard, pointing devices (e.g., mouse, trackball, touchpad, etc.), a barcode scanner, a touch-screen incorporated into a display, audio input devices (e.g., voice recognition systems, microphones, etc.), Human Machine Interfaces (HMI) and other types of input devices. In general, use of the term "input device" is intended to include all possible types of devices and mechanisms for inputting information into computing system 1800. Additionally, user interface output devices 1816 can include a display subsystem, a printer, or non-visual displays such as audio output devices, etc. The display subsystem can be any known type of display device. In general, use of the term "output device" is intended to include all possible types of devices and mechanisms for outputting information from computing system 1800.

Storage subsystem 1806 can include memory subsystem 1808 and file/disk storage subsystem 1810. Subsystems 1808 and 1810 represent non-transitory computer-readable storage media that can store program code and/or data that provide the functionality of embodiments of the present disclosure. In some embodiments, memory subsystem 1808 can include a number of memories including main random access memory (RAM) 1818 for storage of instructions and data during program execution and read-only memory (ROM) 1820 in which fixed instructions may be stored. File storage subsystem 1810 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computing system 1800 is illustrative and not intended to limit embodiments of the present disclosure. Many other configurations having more or fewer components than system 1800 are possible.

The various embodiments further can be implemented in a wide variety of operating environments, which in some cases can include one or more user computers, computing devices or processing devices, which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially available protocols, such as TCP/IP, UDP, OSI, FTP, UPnP, NFS, CIFS, and the like. The network can be, for example, a local-area network, a wide-area network, a virtual private network, the Internet, an intranet, an extranet, a public switched telephone network, an infrared network, a wireless network, and any combination thereof.

In embodiments utilizing a network server, the network server can run any of a variety of server or mid-tier applications, including HTTP servers, FTP servers, CGI servers, data servers, Java servers, and business application servers. The server(s) also may be capable of executing programs or scripts in response to requests from user devices, such as by executing one or more applications that may be implemented as one or more scripts or programs written in any programming language, including but not limited to Java®, C, C# or C++, or any scripting language, such as Perl, Python or TCL, as well as combinations thereof. The server (s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen or keypad), and at least one output device (e.g., a display device, printer or speaker). Such a system may also include one or more storage devices, such as disk drives, optical storage devices, and solid-state storage devices such as RAM or ROM, as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a non-transitory computer readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Non-transitory storage media and computer-readable storage media for containing code, or portions of code, can include any appropriate media known or used in the art such as, but not limited to, volatile and non-volatile, removable and non-removable media implemented in any method or technology for storage of information such as computer-readable instructions, data structures, program modules or other data, including RAM, ROM, Electrically Erasable Programmable Read-Only Memory (EEPROM), flash memory or other memory technology, CD-ROM, DVD or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments. However, computer-readable storage media does not include transitory media such as carrier waves or the like.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims. For instance, any of the examples, alternative examples, etc., and the concepts thereof may be applied to any other examples described and/or within the spirit and scope of the disclosure.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

What is claimed is:

1. A micro-electromechanical system (MEMS) apparatus for beam steering in a Light Detection and Ranging (LiDAR) system of an autonomous vehicle, the apparatus comprising:
    a mirror having a reflective surface and at least first and second respective sides;
    first and second supporting torsion springs, wherein the first and second supporting torsion springs have first ends, respectively, connected to the first and second respective sides of the mirror, on opposite sides, to support the mirror;
    first and second common terminals connected to the first and second supporting torsion springs, respectively, on second ends of the first and second supporting torsion springs;
    a plurality of first fingers extending from the mirror on first and second sides orthogonal to the first and second supporting torsion springs;
    first and second bias terminals opposite the first and second sides of the mirror;
    a plurality of second fingers extending from the first and second bias terminals, the plurality of second fingers being interleaved with the plurality of first fingers and partially overlapping the plurality of first fingers;
    a control circuit for rotating the mirror around an axis of the first and second supporting torsion springs at a resonant frequency;
    an oxide layer below the first and second common terminals and the first and second bias terminals;
    a die substrate below the oxide layer having a first Coefficient of Thermal Expansion (CTE);
    a die attach material coupled to the die substrate having a second CTE;
    a chip package coupled to the die attach material and having a chip package substrate with a third CTE;
    a printed circuit board coupled to the chip package, the printed circuit board having a fourth CTE; and
    means for reducing changes in the resonant frequency due to changes in temperature causing stresses due to a mismatch between the first, second, third and fourth CTE.

2. The apparatus of claim 1 further comprising:
    an array of MEMS mirrors over the die substrate, each MEMS mirror in the array having a reflective surface for intercepting a laser beam and redirecting it toward an environment to be detected.

3. The apparatus of claim 1 wherein the means for reducing changes in the resonant frequency comprises a temperature control element.

4. The apparatus of claim 3 wherein the temperature control element comprises a thermoelectric cooler (TEC).

5. The apparatus of claim 3 wherein the temperature control element comprises at least one heating resistor.

6. The apparatus of claim 1 wherein the means for reducing changes in the resonant frequency comprises a plurality of additional pins attached to the chip package for adding rigidity to the chip package.

7. The apparatus of claim 1 wherein the means for reducing changes in the resonant frequency comprises a plurality of vias providing bending space for a plurality of pins attached to the chip package.

8. A micro-electromechanical system (MEMS) apparatus comprising:
    an array of micro-mirrors having a reflective surface;
    a control circuit for rotating the array of micro-mirrors synchronously at a resonant frequency;
    a die substrate coupled to the array of micro-mirrors and having a first Coefficient of Thermal Expansion (CTE);
    a die attach material coupled to the die substrate having a second CTE;
    a chip package coupled to the die substrate and having a chip package substrate with a third CTE;
    a printed circuit board coupled to the chip package, the printed circuit board having a fourth CTE;
    a temperature sensor mounted proximate the chip package for detecting a temperature proximate the array of micro-mirrors;
    at least one temperature control element mounted proximate to the array of micro-mirrors; and
    a temperature control circuit, coupled to the temperature sensor and the at least one temperature control element, for activating the at least one temperature control element in response to a change in temperature that will change the resonant frequency due to changes in temperature causing stresses due to a mismatch between the first, second, third and fourth CTE.

9. The apparatus of claim 8 wherein the at least one temperature control element comprises a thermoelectric cooler (TEC).

10. The apparatus of claim 9 wherein the at least one temperature control element further comprises:
    a plurality of heating resistors proximate the array of micro-mirrors; and
    wherein the temperature control circuit controls the temperature of the array of micro-mirrors using the TEC, and controls temperatures of different areas in the array of micro-mirrors using the plurality of heating resistors.

11. The apparatus of claim 9 wherein the temperature sensor comprises a thermistor.

12. The apparatus of claim 8 wherein the at least one temperature control element comprises a plurality of heating resistors proximate the array of micro-mirrors.

13. The apparatus of claim 12 wherein a first group of heating resistors proximate edges of the array of micro-mirrors are a different size than a second group of heating resistors proximate a central portion of the array of micro-mirrors.

14. The apparatus of claim 13 wherein the plurality of heating resistors form an array with multiple rows of heating resistors, the heating resistors in each row being connected in series.

15. A method for controlling a resonant frequency of an array of micro-mirrors in a micro-electromechanical system (MEMS) mirror chip, the method comprising:
    providing a die substrate coupled to an array of micro-mirrors and having a first Coefficient of Thermal Expansion (CTE);
    providing a die attach material coupled to the die substrate having a second CTE;
    providing a chip package coupled to the die substrate and having a chip package substrate with a third CTE;
    providing a printed circuit board coupled to the chip package, the printed circuit board having a fourth CTE;
    rotating the array of micro-mirrors synchronously at a resonant frequency;
    detecting a temperature proximate the array of micro-mirrors;
    changing the temperature of the array of micro-mirrors in response to detecting a change in temperature that will change the resonant frequency due to changes in temperature causing stresses due to a mismatch between the first, second, third and fourth CTE.

16. The method of claim 15 further comprising cooling the array of micro-mirrors in response to detecting an increase in temperature that will change the resonant frequency due to an increase in temperature causing stresses due to a mismatch between the first, second, third and fourth CTE.

17. The method of claim 16 further comprising heating portions of the array of micro-mirrors.

18. The method of claim 16 further comprising providing control signals to a thermoelectric cooler (TEC) by a TEC controller to cause the cooling.

19. The method of claim 18 further comprising heating portions of the array of micro-mirrors with an array of heating resistors.

20. The method of claim 15 further comprising:
 detecting a pattern reflected off the array of micro-mirrors;
 determining if the pattern indicates the array of micro-mirrors is not operating at the resonant frequency; and
 changing temperatures of portions of the array of micro-mirrors until the pattern indicates the array of micro-mirrors is operating at the resonant frequency.

* * * * *